(12) United States Patent
Kim et al.

(10) Patent No.: US 11,652,039 B2
(45) Date of Patent: May 16, 2023

(54) PACKAGING SUBSTRATE WITH CORE LAYER AND CAVITY STRUCTURE AND SEMICONDUCTOR DEVICE COMPRISING THE SAME

(71) Applicant: ABSOLICS INC., Covington, GA (US)

(72) Inventors: Sungjin Kim, Suwanee, GA (US); Youngho Rho, Daejeon (KR); Jincheol Kim, Hwaseong-si (KR); Byungkyu Jang, Suwon-si (KR)

(73) Assignee: ABSOLICS INC., Covington, GA (US)

( * ) Notice: Subject to any disclaimer, the term of this patent is extended or adjusted under 35 U.S.C. 154(b) by 0 days.

(21) Appl. No.: 17/433,349

(22) PCT Filed: Mar. 12, 2020

(86) PCT No.: PCT/KR2020/003476
§ 371 (c)(1),
(2) Date: Aug. 24, 2021

(87) PCT Pub. No.: WO2020/185016
PCT Pub. Date: Sep. 17, 2020

(65) Prior Publication Data
US 2022/0051972 A1 Feb. 17, 2022

Related U.S. Application Data

(60) Provisional application No. 62/826,122, filed on Mar. 29, 2019, provisional application No. 62/826,144, (Continued)

(51) Int. Cl.
*H01L 23/498* (2006.01)

(52) U.S. Cl.
CPC .. *H01L 23/49838* (2013.01); *H01L 23/49822* (2013.01); *H01L 23/49827* (2013.01); *H01L 23/49894* (2013.01)

(58) Field of Classification Search
CPC ............... H01L 23/49894; H01L 23/13; H01L 23/49838; H01L 23/49822; H01L 23/5389; H01L 23/15; H01L 23/49827; H01L 21/4857; H01L 2224/18; H01L 3/498; H01L 23/498
USPC ........................................................ 257/668
See application file for complete search history.

(56) References Cited

U.S. PATENT DOCUMENTS 4,835,598 A 5/1989 Higuchi et al.
5,304,743 A 4/1994 Sen et al.
(Continued)

FOREIGN PATENT DOCUMENTS

CN 1317163 A 10/2001
CN 101039549 A 9/2007
(Continued)

OTHER PUBLICATIONS

Korean Written Opinion of the International Searching Authority dated Jul. 1, 2020 in counterpart International Application No. PCT/KR2020/003476 (4 pages in English, 4 pages in Korean).
(Continued)

*Primary Examiner* — Alexander O Williams
(74) *Attorney, Agent, or Firm* — NSIP Law

(57) ABSTRACT

A packaging substrate and a semiconductor device comprising a semiconductor element, include a core layer and an upper layer disposed on the core layer, and the core layer includes a glass substrate as a core of the packaging substrate to improve electrical properties such as a signal transmission rate by connecting the semiconductor element and a mother board to be closer to each other so that electrical signals are transmitted through as short a path as possible.

9 Claims, 13 Drawing Sheets

Related U.S. Application Data filed on Mar. 29, 2019, provisional application No. 62/825,216, filed on Mar. 28, 2019, provisional application No. 62/817,003, filed on Mar. 12, 2019, provisional application No. 62/817,027, filed on Mar. 12, 2019, provisional application No. 62/816,984, filed on Mar. 12, 2019.

(56) References Cited

U.S. PATENT DOCUMENTS

| | | | |
|---|---|---|---|
| 5,414,222 | A | 5/1995 | Sen et al. |
| 8,774,580 | B2 * | 7/2014 | Bolle .................. G02B 6/4214 |
| | | | 385/47 |
| 9,263,370 | B2 | 2/2016 | Shenoy et al. |
| 9,420,708 | B2 | 8/2016 | Hibino et al. |
| 9,768,090 | B2 | 9/2017 | Liang et al. |
| 10,483,210 | B2 | 11/2019 | Gross et al. |
| 2002/0093120 | A1 | 7/2002 | Magni et al. |
| 2006/0202322 | A1 | 9/2006 | Kariya et al. |
| 2008/0217761 | A1 | 9/2008 | Yang et al. |
| 2009/0117336 | A1 | 5/2009 | Usui et al. |
| 2012/0153463 | A1 | 6/2012 | Maeda |
| 2013/0050227 | A1 | 2/2013 | Petersen et al. |
| 2013/0069251 | A1 | 3/2013 | Kunimoto et al. |
| 2013/0293482 | A1 | 11/2013 | Burns et al. |
| 2014/0034374 | A1 | 2/2014 | Cornejo et al. |
| 2014/0085847 | A1 | 3/2014 | Takizawa |
| 2014/0116763 | A1 * | 5/2014 | Sato .................. H05K 3/4697 |
| | | | 29/841 |
| 2014/0116767 | A1 * | 5/2014 | Sato .................. H05K 1/185 |
| | | | 174/260 |
| 2015/0235915 | A1 | 8/2015 | Liang et al. |
| 2015/0235936 | A1 * | 8/2015 | Yu .................. H01L 23/36 |
| | | | 257/737 |
| 2015/0235989 | A1 * | 8/2015 | Yu .................. H01L 25/105 |
| | | | 257/773 |
| 2015/0245486 | A1 | 8/2015 | Shin et al. |
| 2016/0286660 | A1 | 9/2016 | Gambino et al. |
| 2016/0351545 | A1 | 12/2016 | Hong et al. |
| 2017/0040265 | A1 | 2/2017 | Park et al. |
| 2017/0064835 | A1 | 3/2017 | Ishihara et al. |
| 2017/0179013 | A1 | 6/2017 | Kunimoto |
| 2017/0223825 | A1 | 8/2017 | Thadesar et al. |
| 2018/0068868 | A1 | 3/2018 | Jaramillo et al. |
| 2018/0240778 | A1 | 8/2018 | Liu et al. |
| 2018/0342451 | A1 | 11/2018 | Dahlberg et al. |

FOREIGN PATENT DOCUMENTS

| | | |
|---|---|---|
| CN | 101189921 A | 5/2008 |
| CN | 102097330 A | 6/2011 |
| CN | 102106198 A | 6/2011 |
| CN | 102122691 A | 7/2011 |
| CN | 102844857 A | 12/2012 |
| CN | 103208480 A | 7/2013 |
| CN | 106449574 A | 2/2017 |
| CN | 108878343 A | 11/2018 |
| CN | 109411432 A | 3/2019 |
| EP | 0 526 456 B1 | 8/1998 |
| EP | 3 083 125 B1 | 10/2016 |
| JP | 2001-7531 A | 1/2001 |
| JP | 3173250 B2 | 3/2001 |
| JP | 2005-235497 A | 9/2005 |
| JP | 2007-281252 A | 10/2007 |
| JP | 3998984 B2 | 10/2007 |
| JP | 2007-291396 A | 11/2007 |
| JP | 4012375 B2 | 11/2007 |
| JP | 2009-295862 A | 12/2009 |
| JP | 2010-80679 A | 4/2010 |
| JP | 2013-38374 A | 2/2013 |
| JP | 2013-537723 A | 10/2013 |
| JP | 2014-45026 A | 3/2014 |
| JP | 2014-72205 A | 4/2014 |
| JP | 2014-127701 A | 7/2014 |
| JP | 2014-139963 A | 7/2014 |
| JP | 2016-111221 A | 6/2016 |
| JP | 2016-136615 A | 7/2016 |
| JP | 2016-213253 A | 12/2016 |
| JP | 2016-213466 A | 12/2016 |
| JP | 2016-225620 A | 12/2016 |
| JP | 2017-50315 A | 3/2017 |
| JP | 6110437 B2 | 4/2017 |
| JP | 2017-112209 A | 6/2017 |
| JP | 2018-120902 A | 8/2017 |
| JP | 2017-216398 A | 12/2017 |
| JP | 2018-116951 A | 7/2018 |
| JP | 2018-199605 A | 12/2018 |
| JP | 2019-16672 A | 1/2019 |
| KR | 10-1997-0050005 A | 7/1997 |
| KR | 10-0184043 B1 | 5/1999 |
| KR | 10-2001-0107033 A | 12/2001 |
| KR | 10-2002-0008574 A | 1/2002 |
| KR | 20-0266536 Y1 | 2/2002 |
| KR | 10-0447323 B1 | 9/2004 |
| KR | 10-0538733 B1 | 12/2005 |
| KR | 10-0687557 B1 | 2/2007 |
| KR | 10-0720090 B1 | 5/2007 |
| KR | 10-2007-0085553 A | 8/2007 |
| KR | 10-0794961 B1 | 1/2008 |
| KR | 10-0859206 B1 | 9/2008 |
| KR | 10-0870685 B1 | 11/2008 |
| KR | 10-2010-0044450 A | 4/2010 |
| KR | 10-2010-0097383 A | 9/2010 |
| KR | 10-2011-0112974 A | 10/2011 |
| KR | 10-2012-0023120 A | 3/2012 |
| KR | 10-2012-0051992 A | 5/2012 |
| KR | 10-1160120 B1 | 6/2012 |
| KR | 10-2013-0038825 A | 4/2013 |
| KR | 10-2014-0044746 A | 4/2014 |
| KR | 10-1466582 B1 | 11/2014 |
| KR | 10-1468680 B1 | 12/2014 |
| KR | 10-1486366 B1 | 1/2015 |
| KR | 10-2015-0014167 A | 2/2015 |
| KR | 10-1531097 B1 | 6/2015 |
| KR | 10-2015-0145697 A | 12/2015 |
| KR | 10-2016-0048868 A | 5/2016 |
| KR | 10-2016-0094502 A | 8/2016 |
| KR | 10-2016-0114710 A | 10/2016 |
| KR | 10-2016-0124323 A | 10/2016 |
| KR | 10-2016-0141516 A | 12/2016 |
| KR | 10-2017-0084562 A | 7/2017 |
| KR | 10-1760846 B1 | 7/2017 |
| KR | 10-2017-0126394 A | 11/2017 |
| KR | 10-1825149 B1 | 2/2018 |
| KR | 10-1825276 B1 | 2/2018 |
| KR | 10-2018-0040498 A | 4/2018 |
| KR | 10-2018-0067568 A | 6/2018 |
| KR | 10-2018-0088599 A | 8/2018 |
| KR | 10-2018-0116733 A | 10/2018 |
| KR | 10-1903485 B1 | 10/2018 |
| KR | 10-2019-0002622 A | 1/2019 |
| KR | 10-2019-0008103 A | 1/2019 |
| KR | 10-1944718 B1 | 2/2019 |
| KR | 10-2019-0026676 A | 3/2019 |
| TW | 201929100 A | 7/2019 |
| WO | WO 2004/053983 A1 | 6/2004 |
| WO | WO 2006/050205 A2 | 5/2006 |
| WO | WO 2008/013054 A1 | 1/2008 |
| WO | WO 2008/105496 A1 | 9/2008 |
| WO | WO 2012/061304 A1 | 5/2012 |
| WO | WO 2015/198912 A1 | 12/2015 |
| WO | WO 2016/052221 A1 | 4/2016 |
| WO | WO 2017/188281 A1 | 11/2017 |

OTHER PUBLICATIONS

International Search Report dated Jul. 1, 2020 in counterpart International Patent Application No. PCT/KR2020/003476 (2 pages in English and 2 pages in Korean).

Extended European search report dated Dec. 8, 2022, in counterpart European Patent Application No. 20769733.5 (7 pages in English).

(56) References Cited

OTHER PUBLICATIONS

U.S. Appl. No. 17/434,906, filed Aug. 30, 2020, Kim et al., Absolics Inc.
U.S. Appl. No. 17/433,338, filed Aug. 24, 2021, Kim et al., Absolics Inc.
U.S. Appl. No. 17/433,342, filed Aug. 24, 2021, Kim et al., Absolics Inc.

* cited by examiner

PACKAGING SUBSTRATE WITH CORE LAYER AND CAVITY STRUCTURE AND SEMICONDUCTOR DEVICE COMPRISING THE SAME

FIELD

The embodiments relate to packaging substrate and semiconductor device comprising same.

CROSS-REFERENCE TO RELATED APPLICATION

This application is a U.S. National Stage Application of International Application No. PCT/KR2020/003476, filed on Mar. 12, 2020 which claims priority to US Provisional Patent Application No. 62/816,984, filed on Mar. 12, 2019, U.S. Provisional Patent Application No. 62/817,003, filed on Mar. 12, 2019, U.S. Provisional Patent Application No. 62/817,027, filed on Mar. 12, 2019, U.S. Provisional Patent Application No. 62/825,216, filed on Mar. 28, 2019, U.S. Provisional Patent Application No. 62/826,122, filed on Mar. 29, 2019, and U.S. Provisional Patent Application No. 62/826,144, filed on Mar. 29, 2019, and all the benefits accruing therefrom under the priority, the content of which in their entireties are herein incorporated by reference.

RELATED ART

In the manufacturing of electronic components, the implementation of a circuit on a semiconductor wafer is referred to as a Front-End Process (FE), and the assembly of a wafer such that it can be actually used in a product is referred to as a Back-End Process (BE). A packaging process is included in the Back-End process.

Four key technologies of the semiconductor industry that enable the rapid development of electronic products in recent years include semiconductor technology, semiconductor packaging technology, manufacturing process technology, and software technology. Semiconductor technology has been developed in various forms such as line width of a nanometer unit, which is smaller than a micrometer unit, 10 million or more cells, high-speed operation, and much heat dissipation, but technology of packaging it completely is not being supported yet. Thus, the electrical performance of semiconductors may be determined by the packaging technology and the resulting electrical connection rather than the performance of the semiconductor itself.

Ceramic or resin is used as the material of a packaging substrate. In the case of a ceramic substrate such as Si substrate, it is not easy to mount a high-performance and high-frequency semiconductor element thereon due to a high resistance or high dielectric constant. In the case of a resin substrate, it is possible to mount a high-performance and high-frequency semiconductor element thereon, but there is a distinct limitation to the reduction of pitches of wirings.

Recently, research is being conducted to apply silicon or glass to a high-end packaging substrate. By forming a through-via on a silicon or glass substrate and applying a conductive material into the through-via, it is possible to shorten a length of conductive lines between an element and a motherboard, and have excellent electric characteristics.

In addition, a semiconductor package may generate heat during driving, and may additionally include heat-emitting means for emitting such heat.

As related art documents, there are Korean Patent Publication No. 10-2019-0008103, Korean Patent Publication No. 10-2016-0114710, Korean Patent No. 10-1468680, and the like.

DISCLOSURE

Technical Problem

The objective of the embodiment is to manufacture a packaging substrate with a cavity structure and thus provide a more integrated semiconductor device, by applying a glass substrate.

Technical Solution

To achieve the above objective, a packaging substrate according to one embodiment includes:

a core layer, and an upper layer disposed on the core layer, wherein the core layer includes a glass substrate and a core via, the glass substrate is with a first surface and a second surface facing each other, the glass substrate includes a first area with a first thickness, and a second area close to the first area and with a second thickness thinner than the first thickness, the core via penetrating through the glass substrate in a thickness direction is disposed in a plural number, the core layer includes a core distribution layer disposed on a surface of the glass substrate or the core via, at least a part of the core distribution layer electrically connects an electrically conductive layer of the first surface and an electrically conductive layer of the second surface, through the core via, and the upper layer is disposed on the first surface and includes an electrically conductive layer which electrically connect the core distribution layer and semiconductor element unit of external;

wherein a cavity unit disposed above or under the second area; is included, the cavity unit includes an inner space, and a cavity distribution layer electrically connected to the core distribution layer, and a cavity element may be disposed in the inner space.

In one embodiment, a supporting unit protruded to the inner space may be further included in at least one surface of the cavity unit.

In one embodiment, the supporting unit may have an arc-shape connecting one end and the other end of a side surface of the cavity unit.

In one embodiment, the supporting unit may be at least partially connected to one surface in a thickness direction of the first area, and another part of the supporting unit may be protruded to the inner space, fixing the position of a cavity element to be inserted.

In one embodiment, the supporting unit may include a same material with the glass substrate.

In one embodiment, one side surface of the cavity unit is a cavity first side surface, the other side surface different with the cavity first side surface, is a cavity second side surface, and a supporting unit may be respectively disposed at the cavity first side surface and the cavity second side surface.

In one embodiment, the cavity distribution layer may include a cavity distribution pattern which is an electrically conductive layer electrically connected to a cavity element at least a part of which is disposed in the inner space, and electrically connected to the core distribution layer; and a cavity insulating layer which is an insulating layer surrounding the cavity distribution pattern.

In one embodiment, a heat-emitting unit disposed between the core layer and the cavity unit may be included, and the heat-emitting unit may be disposed at a surface where the first area of the glass substrate and the inner space of the cavity unit are in contact.

In one embodiment, the heat-emitting unit may be at least partially connected to the core distribution layer.

To achieve the above objective, a semiconductor device according to one embodiment includes:

a semiconductor element unit where one or more semiconductor elements are disposed; a packaging substrate electrically connected to the semiconductor element; and a motherboard electrically connected to the packaging substrate, transmitting electrical signals of the semiconductor element and external, and connecting each other.

Effects

Packaging substrate and semiconductor device comprising same of the embodiment can significantly improve electrical properties such as a signal transmission rate by connecting the semiconductor element and a motherboard to be closer to each other so that electrical signals are transmitted through as short a path as possible.

Also, since a glass substrate applied as a core of substrate is an insulator itself, there is a lower possibility of generating parasitic element compared to a conventional silicon core, and thus it is possible to simplify a process of treatment for an insulating layer and it is also applicable to a high-speed circuit.

In addition, unlike silicon being manufactured in the form of a round wafer shape, the glass substrate is manufactured in the form of a large panel, and thus mass production is relatively easy and economic efficiency can be further improved.

Furthermore, by disposing the elements such as a transistor inside the packaging substrate, transmitted electrical signals can be transmitted through a shorter path, so it is possible to have excellent performance with a thinner substrate.

Besides, it is possible to fix a cavity element in a more accurate position by a supporting unit inside a cavity unit, and workability may be more improved.

BRIEF DESCRIPTION OF THE DRAWINGS

FIG. 13A and FIG. 13B are conceptual views for illustrating a cavity glass substrate applied with a supporting unit and a core distribution pattern according to an embodiment, by cross sections thereof, wherein FIG. 13A is a cross-section observed at a-a' of FIG. 11 and FIG. 13B is a cross-section of a core distribution pattern formed on FIG. 13A.

DETAILED DESCRIPTION OF EXEMPLARY EMBODIMENTS

Figure 1:
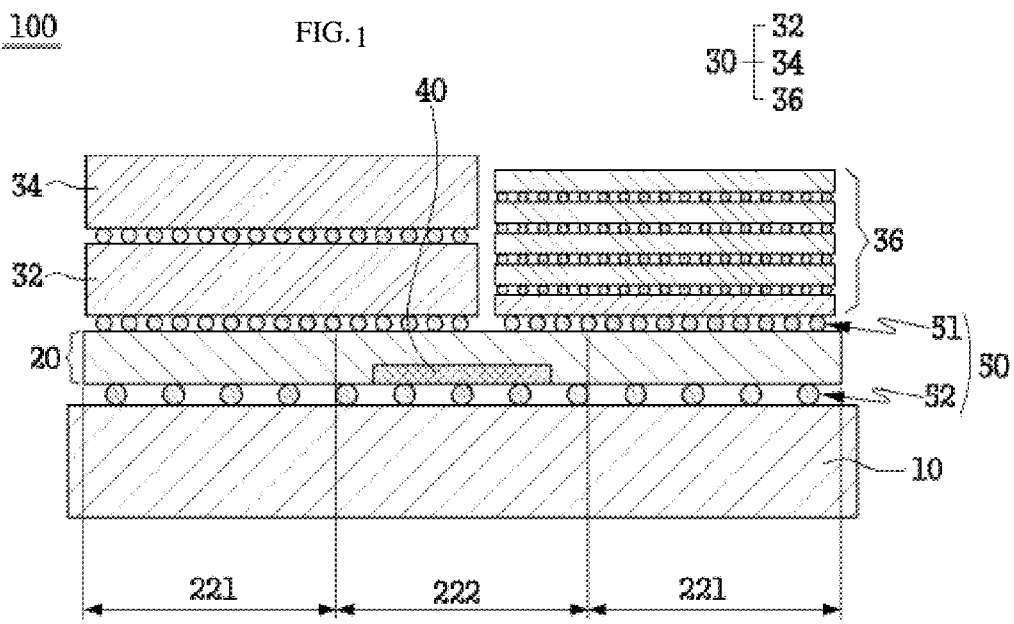
FIG. 1 is a conceptual view for illustrating a cross-section of a semiconductor device according to one embodiment.

Hereinafter, examples will be described in detail with reference to the accompanying drawings so that they can be easily practiced by those skilled in the art to which the embodiment pertains. However, the embodiment may be embodied in many different forms and is not to be construed as being limited to the embodiments set forth herein. Like reference numerals designate like elements throughout the specification.

Throughout the present specification, the phrase "combination(s) thereof" included in a Markush-type expression denotes one or more mixtures or combinations selected from the group consisting of components stated in the Markush-type expression, that is, denotes that one or more components selected from the group consisting of the components are included.

Throughout the present specification, terms such as "first," "second," "A," or "B" are used to distinguish the same terms from each other. The singular forms "a," "an," and "the" include the plural form unless the context clearly dictates otherwise.

Throughout the present specification, the term "X-based" may mean that a compound includes a compound corresponding to X, or a derivative of X.

Throughout the present specification, "B being disposed on A" means that B is disposed in direct contact with A or disposed over A with another layer or structure interposed therebetween and thus should not be interpreted as being limited to B being disposed in direct contact with A.

Throughout the present specification, "B being connected to A" means that B is connected to A directly or through another element therebetween, and thus should not be interpreted as being limited to B being directly connected to A, unless otherwise noted.

Throughout the present specification, a singular form is contextually interpreted as including a plural form as well as a singular form unless specially stated otherwise.

The inventors have recognized that, in the process of developing a semiconductor device capable of exhibiting high performance with a more integrated and thinner thickness, not only the device itself but also the packaging process is an important factor for improving its performance. And while researching this, inventors have confirmed that, by methods such as applying a glass core in a single layer and applying a cavity structure, etc., it is possible to make a packaging substrate thinner and to improve the electrical properties of the semiconductor device, unlike a conventional interposer and organic substrate in which two or more layers of cores are applied on a motherboard as a packaging substrate, and thereby completed the invention.

In addition, the inventors have confirmed that, by methods such as applying a heat-emitting unit capable of transferring the heat generated by an inner element to the external, it is possible to make a packaging substrate as a thinner packaging substrate, and improve the electrical properties of semiconductor device, and thereby completed the invention.

Also, when an element is disposed in such cavity structure, performance of a semiconductor device can be more improved in case the element is disposed at an accurate position which is predetermined, and the position is maintained, so the inventors have recognized that workability of manufacturing a substrate and performance of a packaging substrate can be more improved by further applying a supporting unit for guiding and supporting the position of an element inside a cavity space, and thus have completed this invention.

Figure 2:
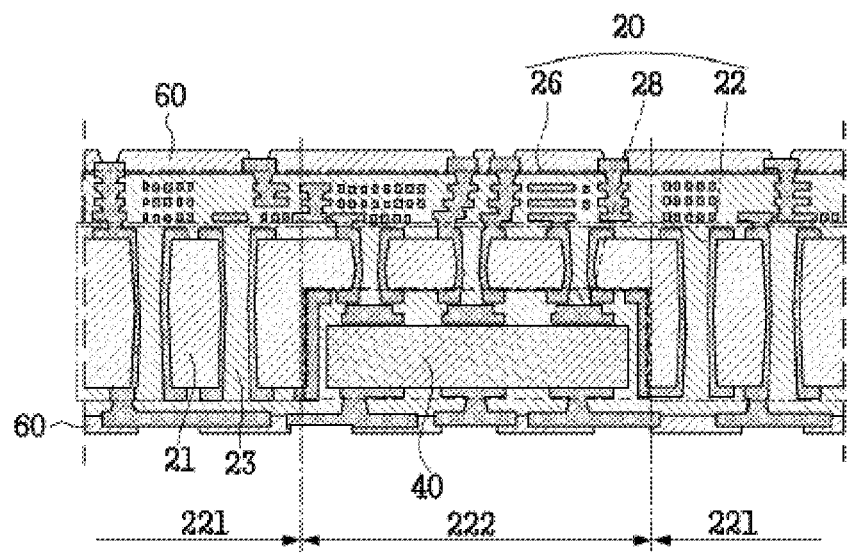
FIG. 2 is a conceptual view for illustrating a cross-section of a packaging substrate according to another embodiment.
Figure 3A:
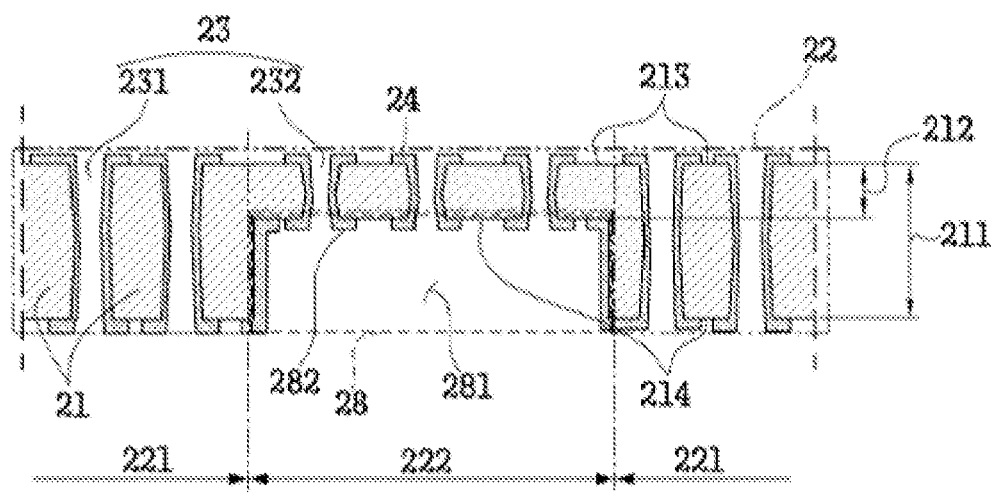
FIG. 3A and FIG. 3B are conceptual views for illustrating a part of a packaging substrate according to an embodiment by a cross-section thereof, respectively.
Figure 3B:
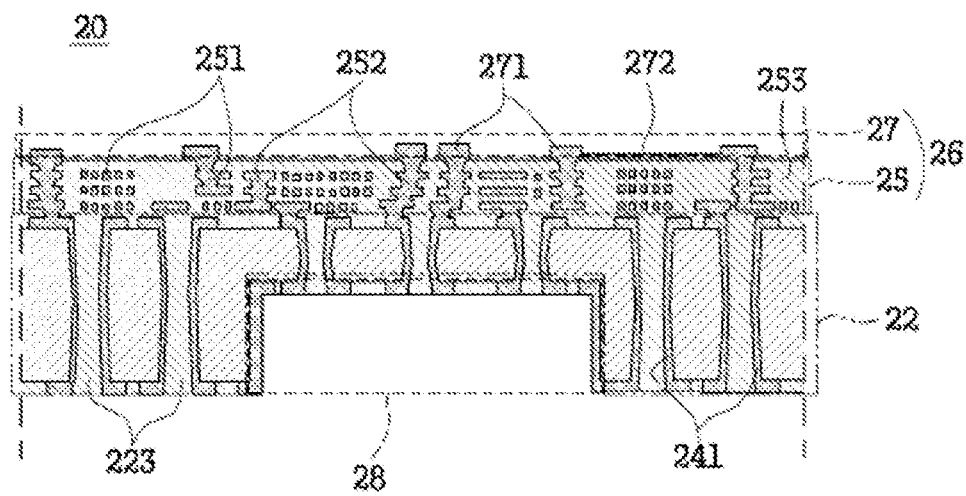
Figure 4A:
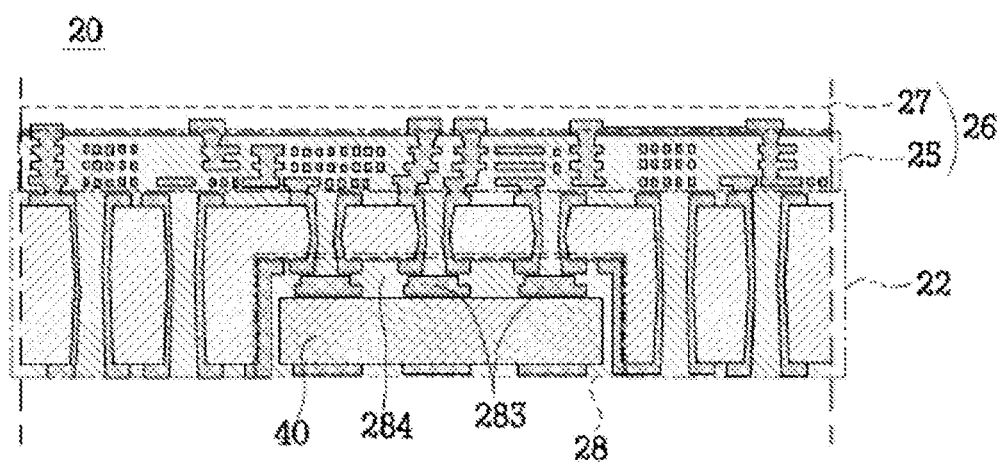
FIG. 4A and FIG. 4B are conceptual views for illustrating a part of a packaging substrate according to an embodiment by a cross-section thereof, respectively.
Figure 4B:
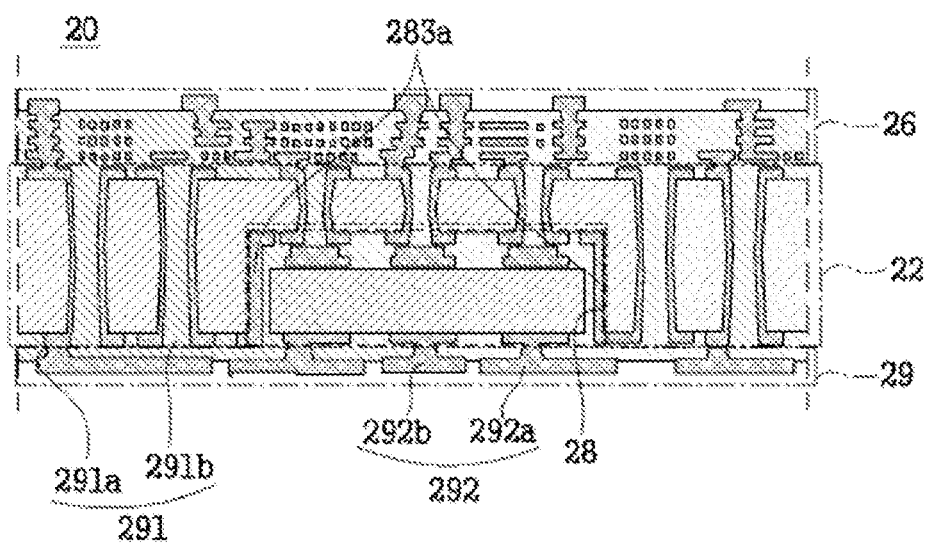
Figure 5:
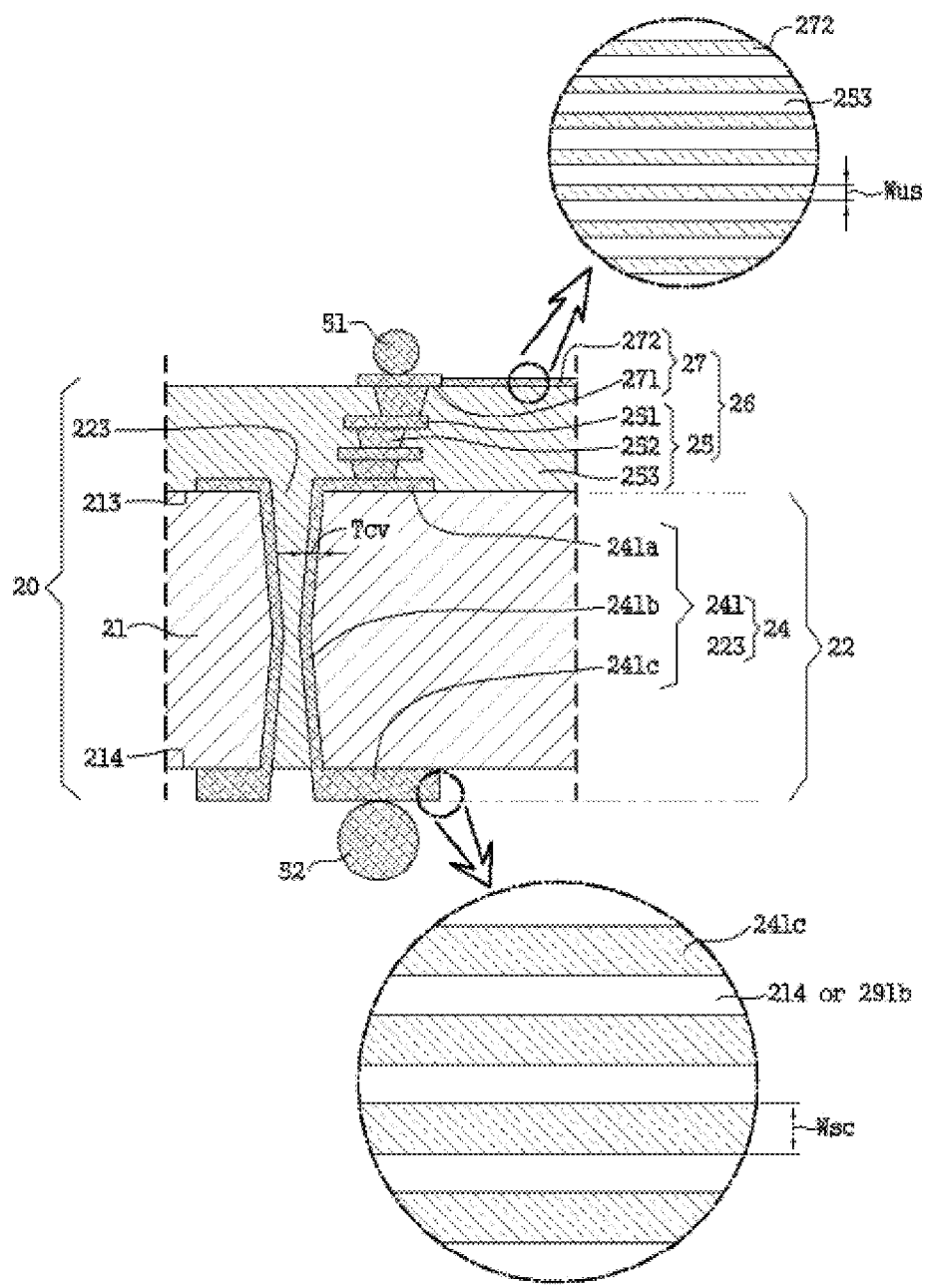
FIG. 5 is detailed conceptual view for illustrating some parts of cross sections of a packaging substrate according to an embodiment (a circle indicates a view obtained through observation from the top or the bottom).
Figure 6:
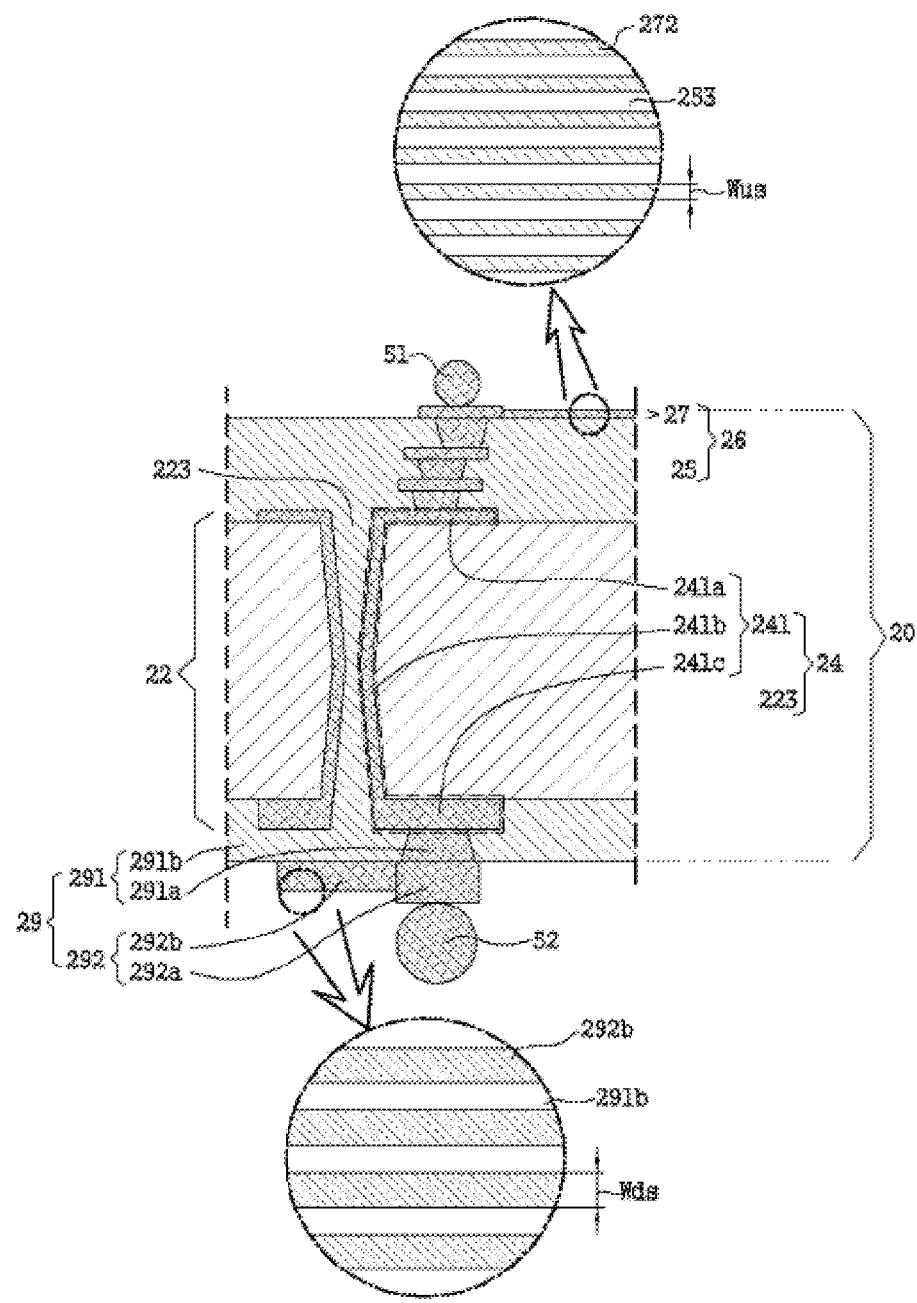
FIG. 6 is detailed conceptual view for illustrating some parts of cross sections of a packaging substrate according to an embodiment (a circle indicates a view obtained through observation from the top or the bottom).
Figure 7A:
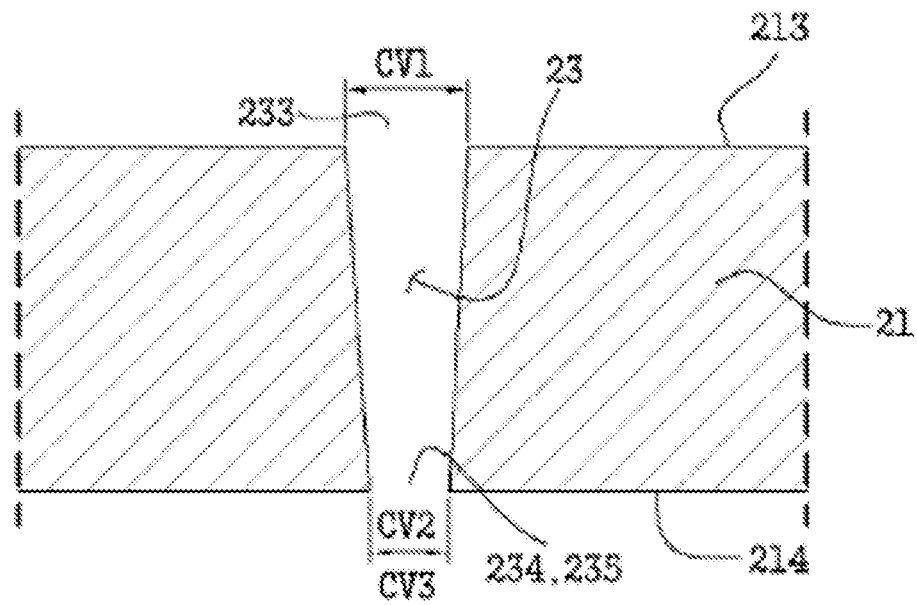
FIG. 7A and FIG. 7B are conceptual views for illustrating a shape of a core via formed on a glass substrate according to an embodiment by a cross-section thereof, respectively.
Figure 7B:
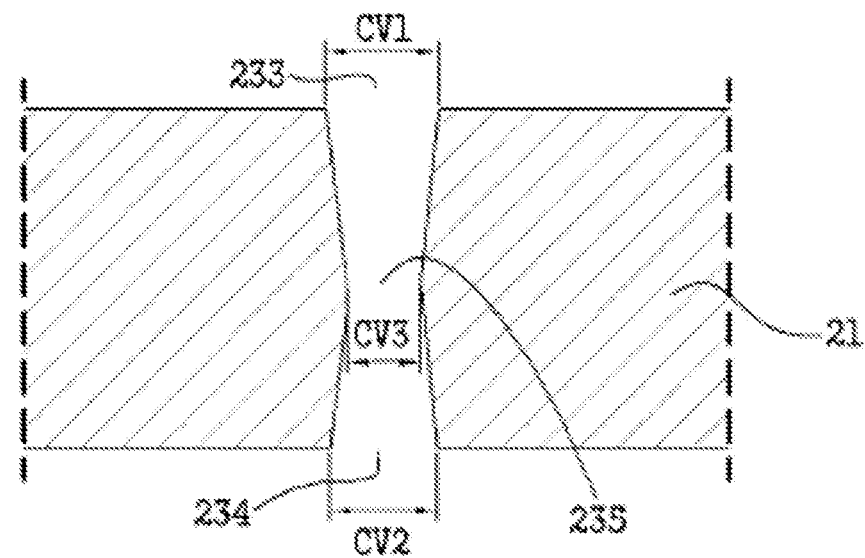
Figure 8:
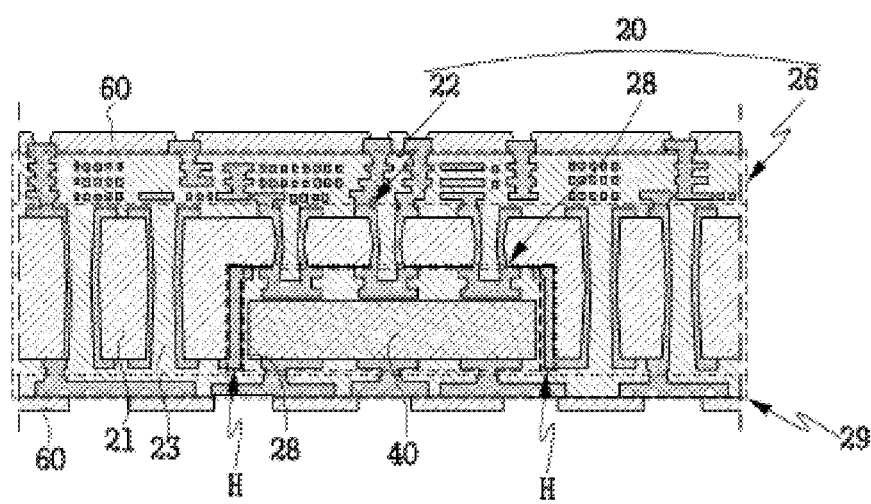
FIG. 8 is a conceptual view for illustrating a structure of a packaging substrate according to another embodiment by a cross-section thereof.
Figure 9A:
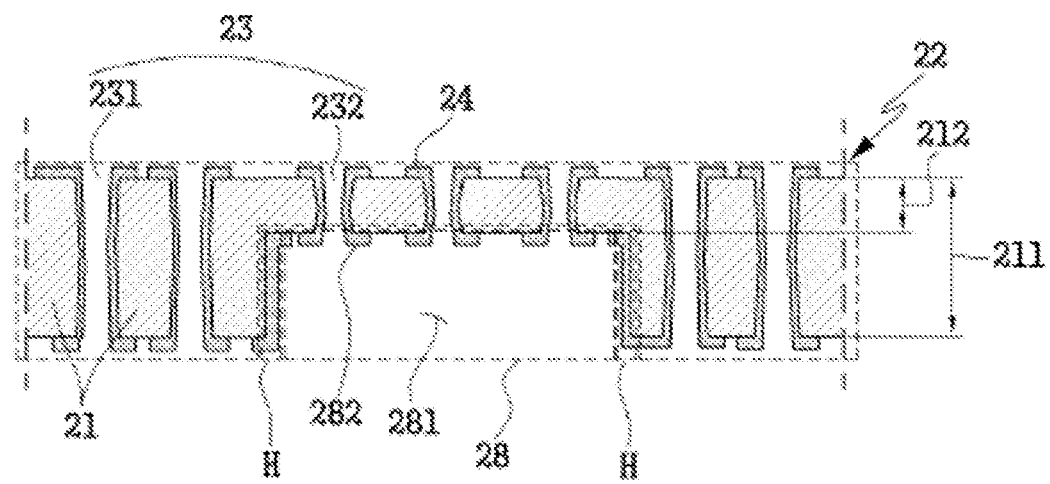
FIG. 9A and FIG. 9B are conceptual views for illustrating some parts of a packaging substrate according to another embodiment, respectively.
Figure 9B:
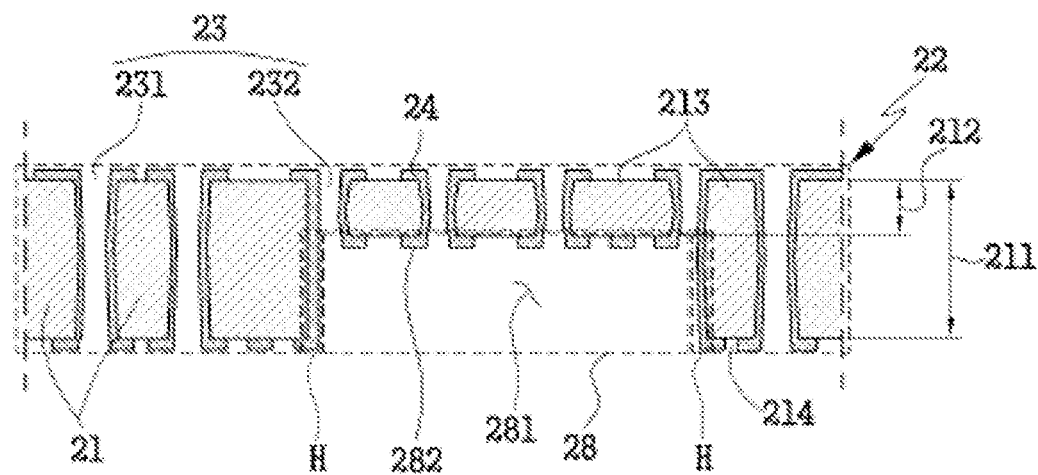
Figure 10A:
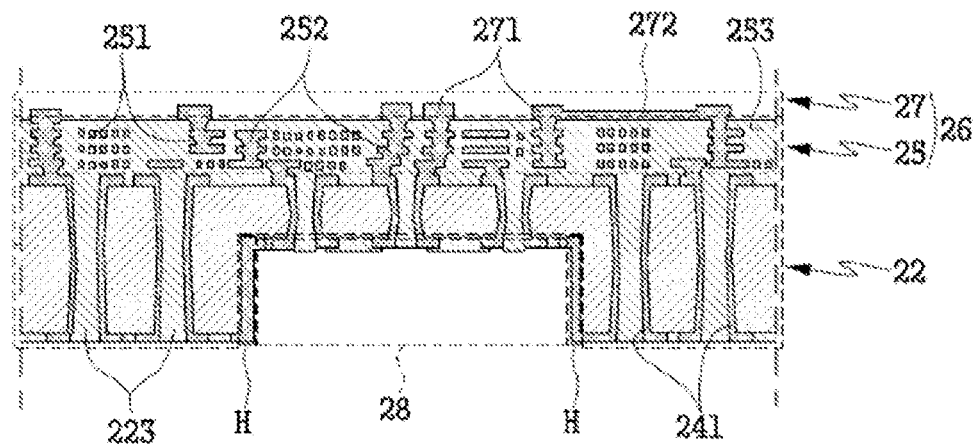
FIG. 10A and FIG. 10B are conceptual views for illustrating some parts of a packaging substrate of another embodiment, respectively.
Figure 10B:
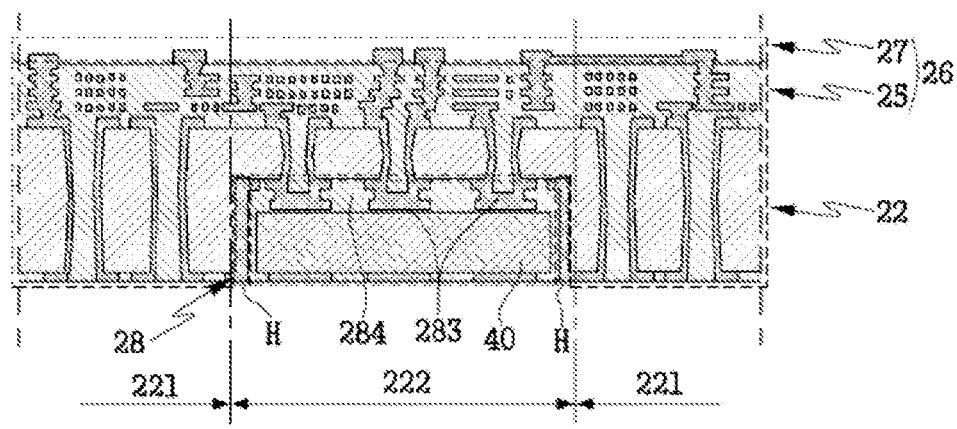
Figure 11A:
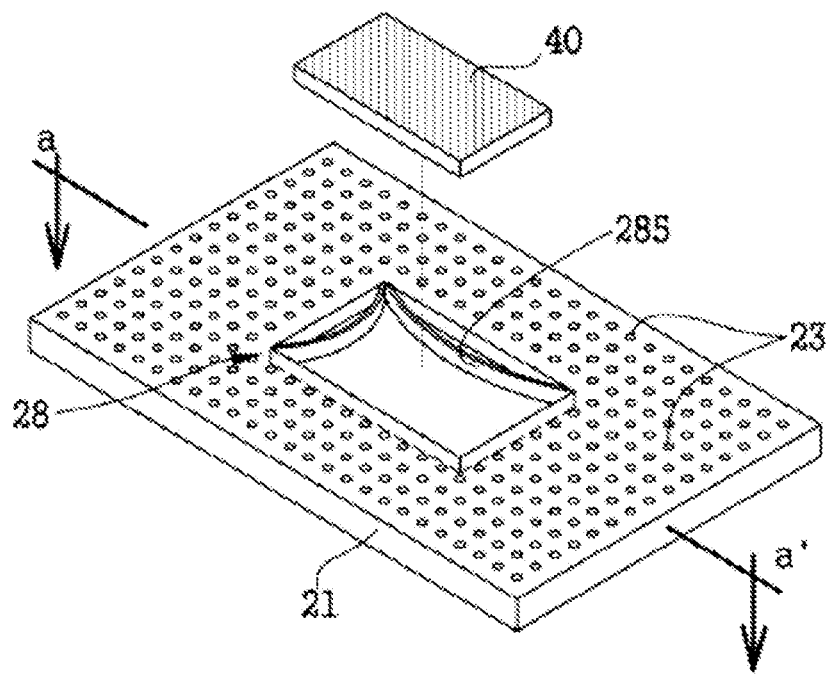
FIG. 11A and FIG. 11B are conceptual views for illustrating a shape of cavity element fixed on the glass substrate having a cavity unit which is applied with a supporting unit, according to an embodiment.
Figure 11B:
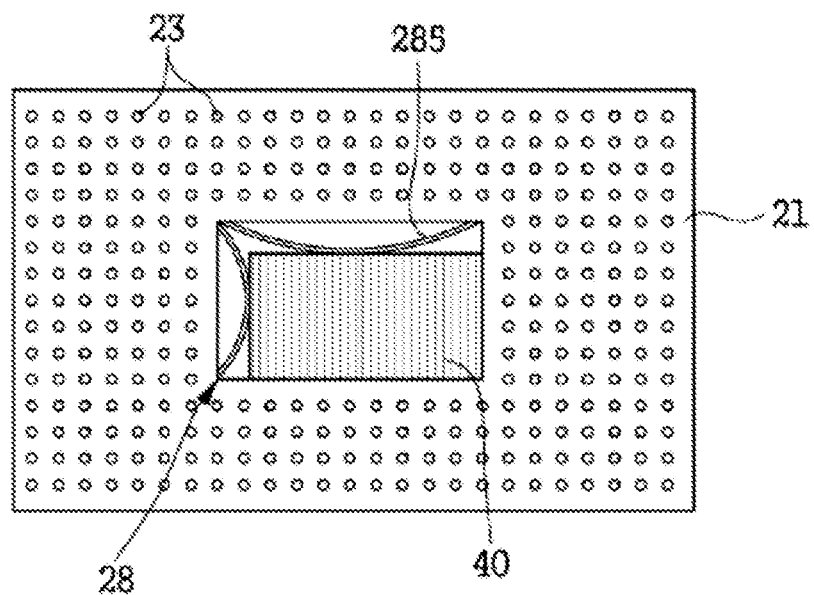
Figure 12:
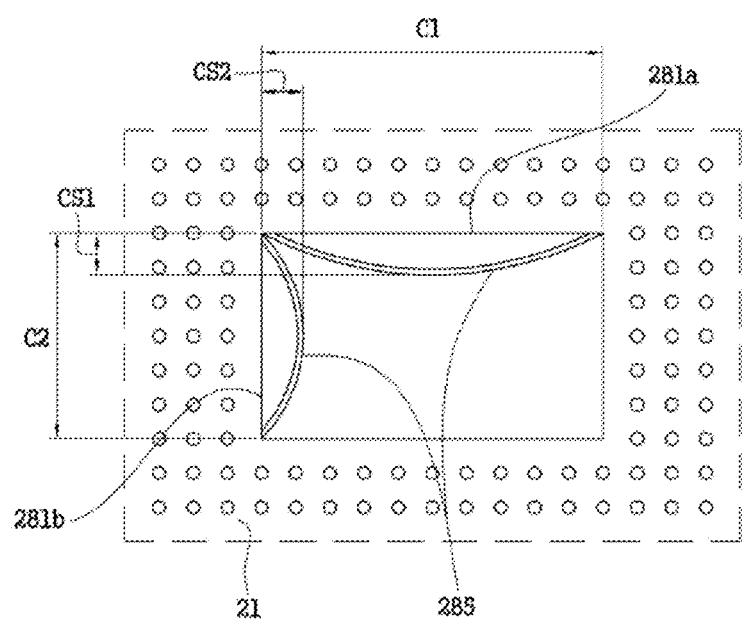
FIG. 12 is a conceptual view for illustrating a top view of a glass substrate having a cavity unit which is applied with a supporting unit according to an embodiment.
Figure 13A:
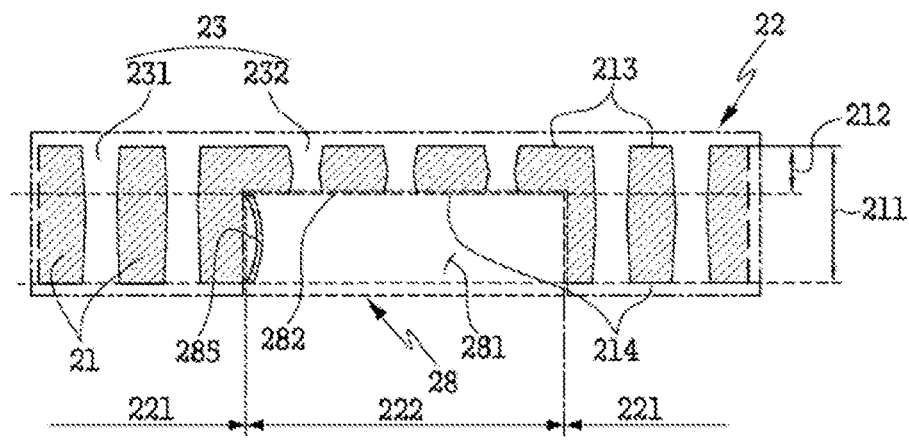
Figure 13B:
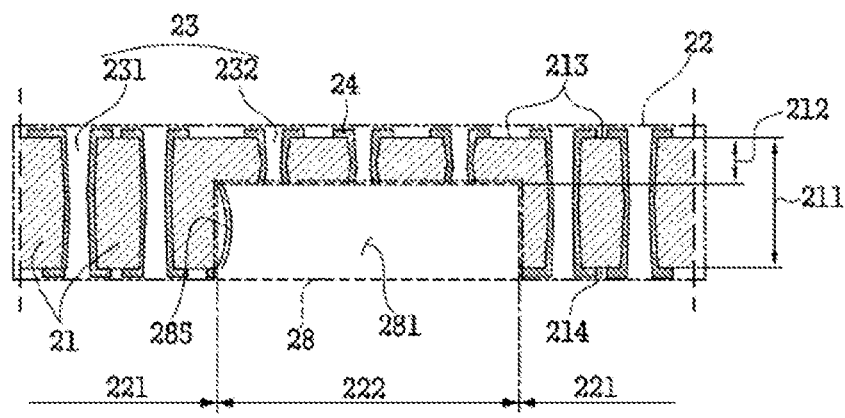
Figure 14:
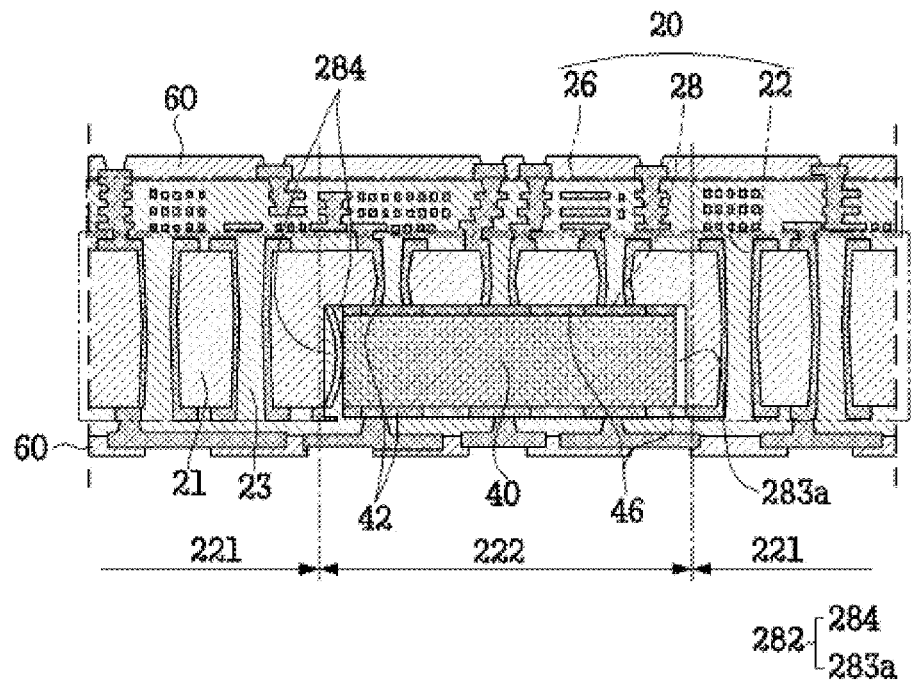
FIG. 14 is a conceptual view for illustrating a core unit and a cavity unit in a packaging substrate applied with a supporting unit according to an embodiment, by a cross-section thereof.
Figure 15:
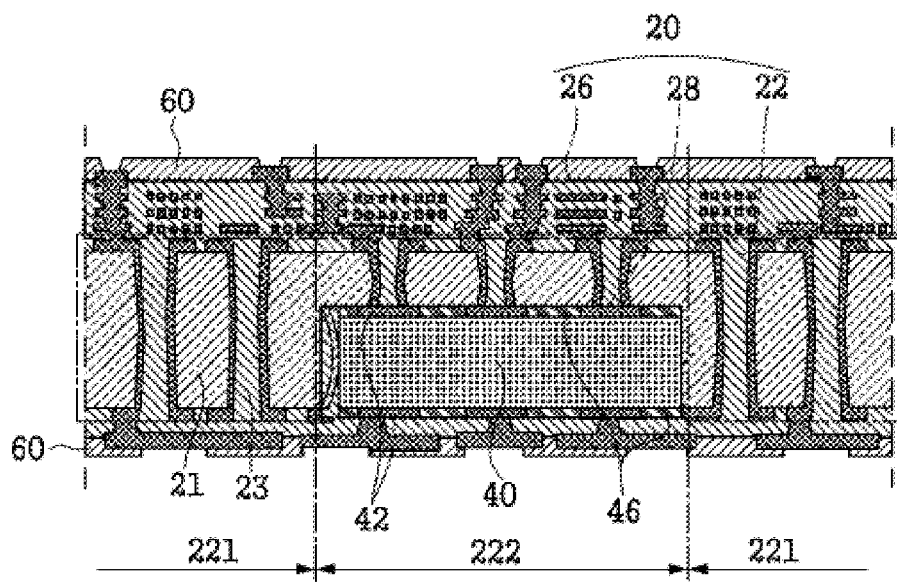
FIG. 15 is a conceptual view for illustrating a cross section of a packaging substrate applied with a supporting unit according to an embodiment.

FIG. 1 is a conceptual view for illustrating a cross section of a semiconductor device according to one embodiment, FIG. 2 is a conceptual view for illustrating a structure of a packaging substrate according to another embodiment, by cross-section thereof, FIG. 3A and FIG. 3B are conceptual views for illustrating a part of a packaging substrate according to an embodiment by a cross-section thereof, respectively, FIG. 4A and FIG. 4B are conceptual views for illustrating a part of a packaging substrate according to an embodiment by a cross-section thereof, respectively, FIG. 5 is detailed conceptual view for illustrating some parts of cross sections of a packaging substrate according to an embodiment (a circle indicates a view obtained through observation from the top or the bottom), FIG. 6 is detailed conceptual view for illustrating some parts of cross sections of a packaging substrate according to an embodiment (a circle indicates a view obtained through observation from the top or the bottom). Also, FIG. 7A and FIG. 7B are conceptual views for illustrating a shape of a core via formed on a glass substrate according to an embodiment by a cross-section thereof. FIG. 8 is a conceptual view for illustrating a structure of a packaging substrate according to another embodiment by a cross-section thereof, FIG. 9A and FIG. 9B are conceptual views for illustrating some parts of a packaging substrate according to another embodiment, respectively. FIG. 10A and FIG. 10B are conceptual views for illustrating some parts of a packaging substrate of another embodiment, respectively, FIG. 11A and FIG. 11B are conceptual view for illustrating a shape of cavity element fixed on the glass substrate having a cavity unit which is applied with a supporting unit, according to an embodiment. FIG. 12 is a conceptual view for illustrating a top view of a glass substrate having a cavity unit which is applied with a supporting unit according to an embodiment, FIG. 13A and FIG. 13B are conceptual views for illustrating a cavity glass substrate applied with a supporting unit and a core distribution pattern according to an embodiment, by cross sections thereof, wherein FIG. 13A is a cross-section observed at a-a' of FIG. 11 and FIG. 13B is a cross-section of a core distribution pattern formed on FIG. 13A. FIG. 14 is a conceptual view for illustrating a core unit and a cavity unit in a packaging substrate applied with a supporting unit according to an embodiment, by a cross-section thereof, FIG. 15 is a conceptual view for illustrating a cross section of a packaging substrate applied with a supporting unit according to an embodiment. Hereinafter, the embodiment will be described in more detail with reference to the above FIGs.

To achieve the above objective, a semiconductor device 100 according to the embodiment comprises a semiconductor element unit 30 where one or more semiconductor elements 32, 34, and 36 are disposed; a packaging substrate 20 electrically connected to the semiconductor element; and a motherboard 10 electrically connected to the packaging substrate, transmitting electrical signals of the semiconductor element and external, and connecting each other.

The packaging substrate 20 according to another embodiment comprises a core layer 22, an upper layer 26 disposed on one surface of the core layer; and a cavity unit 28 where a cavity element 40 is possible to be disposed.

The packaging substrate further comprises a heat-emitting unit H disposed between the core layer and the cavity unit; and/or a supporting unit 285 protruded to the inner space, in at least one surface of the cavity unit.

The semiconductor element unit 30 refers to the elements mounted on a semiconductor device and is mounted on the packaging substrate 20 through a connecting electrode or the like. In detail, for example, a computation element (a first element 32 and a second element 34) such as a central processing unit (CPU) and a graphics processing unit (GPU), a memory element (a third element 36) such as a memory chip, or the like may be applied as the semiconductor element unit 30, but any semiconductor element capable of being mounted on a semiconductor device may be applicable without limitation.

A motherboard such as a printed circuit board and a printed wiring board may be applied as the motherboard 10.

The packaging substrate 20 may further comprise a lower layer 29 disposed under the core layer, optionally.

The core layer 22 comprises a glass substrate 21 comprising a first area 221 with a first thickness 211 and a second area 222 close to the first area and with a second thickness 212 thinner than the first thickness; a plurality of core via 23 penetrating through the glass substrate 21 in a thickness direction; and a core distribution layer 24 disposed on a surface of the glass substrate or the core via, and electrically connects the first surface 213 of the glass substrate and the second surface 214 facing the first surface, through the core via.

The core layer 22 comprises a first area 221 with a first thickness 211 and a second area 222 close to the first area and with a second thickness 212 thinner than the first thickness, and the second area may serve as a cavity structure.

Within the same area, the glass substrate 21 has a first surface 213 and a second surface 214 facing each other, and the two surfaces are substantially parallel to each other and have an overall uniform thickness throughout the glass substrate.

One feature of the glass substrate 21 with a first surface 213 and a second surface 214 facing each other, is that the first thickness 211 which is a thickness of the first area is thicker than the second thickness 212 which is a thickness of the second area. Accordingly, in the part where the first area and the second area are in contact, a side surface wall which is one surface of the first area in a thickness direction is exposed in a place where a core via is not formed in the glass substrate. In addition, an inner space 281 formed by thickness difference between the first area and the second area serves as accommodating some of or all the cavity elements.

A supporting unit 285 protruded to the inner space 281 of a cavity may be disposed at one surface in a thickness direction, of the first area where the side surface wall is exposed. The supporting unit 285 may have at least one part connected to one surface in a thickness direction of the first area, and the supporting unit 285 may have another part protruded to the inner space 281, thereby fixing the position of a cavity element 40 to be inserted.

The glass substrate 21 in a form that the first area and the second area with different thicknesses neighbor to each other like this, may be manufactured by stacking or combining glass substrates with different sizes, and it is desirable to manufacture by a method of removing difference between the first thickness and the second thickness in the glass substrate, considering durability, manufacturing efficiency, and the like. In this time, the removing is an etching process which is proceeded simultaneously or separately, with a process for forming a core via described below, and a method such as applying mechanical strength for removing to a part where the bonding strength is weakened, may be applied, but not limited thereto.

The glass substrate 21 may form the supporting unit 285 at the same time with the removing. In detail, when after a defect is formed at the glass substrate 21 by a method such as laser irradiation, a via or a cavity unit is formed by a method of etching by applying a strong acid such as hydrofluoric acid, it is possible to form a supporting unit beside the cavity unit by regulating an interval and an intensity of the laser irradiation, but the method of manufacturing the supporting unit is not limited to the method described above.

The glass substrate 21 may have a core via 23 penetrating through the first surface and the second surface. The core via 23 may be formed in both the first area and the second area, and may be formed with an intended pitch and pattern.

Conventionally, a silicon substrate and an organic substrate were applied to the packaging substrate of the semiconductor device, in a shape of being stacked. In case of a silicon substrate, when it is applied to a high-speed circuit, a parasitic element effect may occur due to its semiconductor property, and there is an advantage of relatively large power loss. Also, in case of an organic substrate, it requires a larger area to form a more complicated distribution pattern, but this does not correspond to the miniaturization trend of electronic devices. In order to form a complicated distribution pattern within a predetermined size, it is necessary to make patterns finer substantially, but there has been a practical limit to the miniaturization of the patterns due to a material property of the polymer, etc., applied to an organic substrate.

In the embodiment, the glass substrate 21 is applied as a supporting body for the core layer 22 to solve these problems. Also, by applying a glass substrate and the core via 23 formed to penetrating through the glass substrate, it is possible to provide a packaging substrate 20 having a shortened electrical flow length, a smaller size, a faster response, and a lower loss property.

As the glass substrate 21, a glass substrate applied to semiconductor can be applied. For example, a borosilicate glass substrate, a non-alkali glass substrate, or the like may be applicable, but not limited thereto.

The glass substrate 21 may have a thickness 211 (A first thickness) measured at a first area of 1,500 μm or less, 300 to 1,200 μm, 350 to 900 μm or 350 to 700 μm. Although applying a thinner packaging substrate is advantageous in that electrical signal transmission can be made more efficient, but the packaging substrate also should serve as a supporting body of packaging, so it is preferable to apply the glass substrate 21 having the above thickness.

The glass substrate 21 may have a thickness 212 (A second thickness) of second area of 80% or less, 20 to 80%, or 30 to 70% of the first thickness. Also, specifically, the glass substrate 21 may have a thickness 212 (A second thickness) measured at a second area of 1,000 μm or less, 700 μm or less, or 500 μm or less. Also, the second thickness 212 may be 100 to 500 μm, or 100 to 350 μm. In addition, the thickness difference between the first area and the second area may be greater than a thickness of a cavity element. When applying a glass substrate of the second area with such thickness, it is possible to form a cavity structure more efficiently and stably.

Here, the thickness of the glass substrate may be the thickness of the glass substrate itself except for the thickness of an electrically conductive layer on the glass substrate.

A difference between the second thickness and the first thickness of the glass substrate 21 may be smaller or greater than a thickness of the cavity element. When the difference is smaller than the thickness of the cavity element, disposing the total cavity element in the inner space may be difficult, and in this case, there is a possibility of a packaging substrate structure to be more complicated. Accordingly, it is desirable that the difference is greater than the thickness of the cavity element for simplifying the structure of a packaging substrate.

A height of the inner space may be 50 μm to 500 μm, 150 μm to 450 μm, or 250 μm to 400 μm.

The core via 23 penetrates through the glass substrate 21. The core via may be formed by removing a predetermined region of the glass substrate 21. In detail, it may be formed by etching a glass plate physically and/or chemically.

In detail, the core via 23 may be formed by applying a method of forming a defect (flaw) on the surface of the glass substrate by means of a laser or the like and then chemical etching, laser etching, or the like, but not limited thereto.

The core via 23 comprises a first opening part 233 in contact with the first surface; a second opening part 234 in contact with the second surface; and a minimum inner diameter part 235 which is an area with the narrowest inner diameter in the entire core via connecting the first opening part and the second opening part.

A first opening part diameter CV1 which is a diameter of the first opening part and a second opening part diameter CV2 which is a diameter of the second opening part may substantially differ, or the first opening part diameter CV1 and the second opening part diameter CV2 may be substantially equal.

In the latter case of substantially same diameter, the shape of core via 23 observed by the cross section is substantially as a quadrangle shape, that may be overall cylindrical type core via, or overall barrel type core via whose diameter becomes somewhat narrower in a center part based on a thickness of the glass substrate (refer to FIG. 7B).

In the former case of substantially different diameter, one of two opening parts CV1 and CV2 has a smaller diameter than the other, and may be truncated cone shape whose cross section is substantially a trapezoid (refer to FIG. 7A).

The first surface opening part diameter and the second surface opening part diameter may be 150 μm or less, 40 to 200 μm, or 70 to 120 μm, respectively.

The minimum inner diameter part may be disposed at the first opening part or the second opening part. In this case, a core via may be a cylindrical-type or a (truncated) trigonal-pyramid-type. In this case, a diameter CV3 of the minimum inner diameter part corresponds to a diameter of a smaller one between the first opening part and the second opening part.

The minimum inner diameter part may be disposed between the first opening part and the second opening part. In this case, the core via may be a barrel-type core via. In this case, the diameter CV3 of the minimum inner diameter part may be smaller than a larger one between a diameter of the first opening part and a diameter of the second opening part. When at least a part of the core via 23 has a narrowing area, a size of the narrowed minimum inner diameter CV3 may be the size of 50 to 99% or the size of 70 to 95%, based on a larger one between the first surface opening part diameter CV1 and the second surface opening part diameter CV2. In case of having a narrowed diameter size to this range, electrically conductive layer formation, and the like can proceed more smoothly.

The minimum inner diameter part may have an average diameter of 50 μm to 95 μm.

The minimum inner diameter part may satisfy the condition of Equation 1 below.

$$0.83 \times D_{90} \leq D_{50} \leq 1.25 \times D_{10} \qquad \text{[Equation 1]}$$

In the Equation 1, $D_{50}$ is a value corresponding to 50% in the diameter distribution of the minimum inner diameter part, $D_{90}$ is a value corresponding to 90% in the diameter distribution of the minimum inner diameter part, and $D_{10}$ is a value corresponding to 10% in the diameter distribution of the minimum inner diameter part.

In further detail, the minimum inner diameter part may have an average diameter of 55 μm to 85 μm, or 60 μm to 70 μm.

In further detail, the minimum inner diameter part may satisfy the condition of Equation 1-1 below.

$$0.88 \times D_{90} \leq D_{50} \leq 1.18 \times D_{10} \qquad \text{[Equation 1-1]}$$

In the Equation 1, $D_{50}$ is a value corresponding to 50% in the diameter distribution of the minimum inner diameter part, $D_{90}$ is a value corresponding to 90% in the diameter distribution of the minimum inner diameter part, and $D_{10}$ is a value corresponding to 10% in the diameter distribution of the minimum inner diameter part.

In detail, a target opening part which is a larger one between the first opening part diameter and the second surface opening part diameter, may have an average diameter of 70 to 120 μm.

In detail, a target opening part which is a larger one between the first surface opening part diameter and the second opening part diameter may satisfy the condition of Equation 2 below.

$$0.9 \times D_{90} \leq D_{50} \leq 1.1 \times D_{10} \qquad \text{[Equation 2]}$$

In the Equation 2, $D_{50}$ is a value corresponding to 50% in the diameter distribution of a target opening part, $D_{90}$ is a value corresponding to 90% in the diameter distribution of a target opening part, and $D_{10}$ is a value corresponding to 10% in the diameter distribution of a target opening part.

In detail, a target opening part which is a larger one between the first surface opening part diameter and the second surface opening part diameter, may have an average diameter of 80 μm to 105 μm.

In detail, a target opening part which is a larger one between the first opening part diameter and the second opening part diameter may satisfy the condition of Equation 2-1 below.

$$0.92 \times D_{90} \leq D_{50} \leq 1.08 \times D_{10} \qquad \text{[Equation 2-1]}$$

In the Equation 2-1, $D_{50}$ is a value corresponding to 50% in the diameter distribution of a target opening part, $D_{90}$ is a value corresponding to 90% in the diameter distribution of a target opening part, and $D_{10}$ is a value corresponding to 10% in the diameter distribution of a target opening part.

In the core via, an average diameter of a target opening part which is a larger one between the first opening part diameter, which is a diameter at an opening part in contact with the first surface, and the second opening part diameter, which is a diameter at an opening part in contact with the second surface, may have a larger value than $D_{50}$, which is a value corresponding to 50% in the diameter distribution of a target opening part.

The diameter distribution described above, is evaluated based on a diameter which is observed and measured by microscope in the cross-section, after dividing prepared samples into 9 compartments (3×3), and processing of cutting the samples of 5 areas of top left, bottom left, center, top right, and bottom right.

When the entire length of the core via is 100%, the point at which the minimum inner diameter part is located may be the point of 40% to 60% based on the first opening part, and may be the point of 45% to 55%. When the minimum inner diameter part is at the position described above, based on the entire length of core via, the design of electrically conductive layer of packaging substrate and the process of forming electrically conductive layer may be easier.

A thickness of an electrically conductive layer measured at a larger one between the first opening part diameter CV1 and the second opening part diameter CV2 may be the same as or thicker than a thickness of an electrically conductive layer formed on a part CV3 with a minimum inner diameter in the core via.

The core via 23 may be disposed in the number of 100 to 3000, may be disposed in the number of 100 to 2500, or may be disposed in the number of 225 to 1024, based on a unit area (1 cm×1 cm) of the glass substrate 21. When the core via satisfies the above pitch condition, the formation of an electric conductive layer, etc., and the performance of a packaging substrate can be improved.

The core via 23 may be disposed at the glass substrate 21 in a pitch of 1.2 mm or less, may be disposed in a pitch of 0.12 to 1.2 mm, may be disposed in a pitch of 0.3 to 0.9 mm. In this case, it is advantageous to form an electrically conductive layer, etc., while maintaining the mechanical properties of the glass substrate above certain level.

On the first surface 213 of the glass substrate 21, a stress measured at a plain line which is a line linking places where the core via 23 is not formed, and a stress measured at a via line which is a line linking places where the core via 23 is formed, may have a stress difference value (P) of 1.5 MPa or less.

$$P = Vp - Np \qquad \text{Equation (1)}$$

In the Equation (1), the P is a stress difference value measured at the same glass substrate, the Vp is a difference between the maximum value and the minimum value of stress measured at a via line, and the Np is a difference between the maximum value and the minimum value of stress measured at a plain line.

The P value may be 1.35 MPa or less, the P value may be 1.2 MPa or less or 1.1 MPa or less. Also, the P value may be 0.01 MPa or more, or 0.1 MPa or more.

When a glass substrate with the above stress difference value (P) is applied as a substrate for semiconductor packaging, it is possible to manufacture a packaging substrate having more stable mechanical properties.

The Vp value of the glass substrate may be 2.5 MPa or less, or 2.3 MPa or less, and the Vp value may be 2.0 MPa or less, or 1.8 MPa or less. Also, the Vp value may be 0.2 MPa or more, or 0.4 MPa or more.

When a glass substrate with difference (Vp) in these ranges between the maximum value and the minimum value of stress measured at a via line, is applied as a substrate for semiconductor packaging, it is possible to manufacture a packaging substrate having more stable mechanical properties.

The Np value of the glass substrate may be 1.0 MPa or less, 0.9 MPa or less, or 0.8 MPa or less. Also, the Np value of the glass substrate may be 0.1 MPa or more, or 0.2 MPa or more.

When a glass substrate whose difference (Np) in these ranges between the maximum value and the minimum value of stress measured at a plain line, is applied as a substrate for semiconductor packaging, it is possible to manufacture a packaging substrate having more stable mechanical properties.

The glass substrate may be the one satisfying the condition that a stress difference ratio (K) according to below equation (2), is 6 or less.

$$K = Lp/La \quad \text{Equation (2):}$$

In the Equation (2), the K is a stress difference ratio measured at the same plane of the same glass substrate, the Lp is a difference between the maximum value and the minimum value of stress measured at a target line which is the one selected from a plain line which is a line linking places where a core via is not formed, or a via line which is a line linking places where a core via is formed, and the La is an average value of stress measured at the target line.

The K value of the glass substrate may be 5 or less, 4.5 or less, or 4 or less. When a glass substrate with the above K value is applied as a substrate for semiconductor packaging, it is possible to manufacture a packaging substrate having more stable mechanical properties.

The stress difference ratio (K) may be the one measured at a plain line and its value may be 2 or less. In detail, the stress difference ratio (Kn) at a plain line may be 1.8 or less, more than 0.3, or more than 0.5.

The stress difference ratio (K) may be the one measured at a via line and its value may be 6 or less or 5 or less. The stress difference ratio (Kv) of a via line may be 4.5 or less, or 3 or less. Also, the stress difference ratio (Kv) of a via line may be 0.5 or more, 1.0 or more, or 1.5. or more.

In case of having such a stress difference ratio K and applying a core via-formed-glass substrate as a substrate for semiconductor packaging, it is possible to manufacture a packaging substrate having more stable mechanical properties.

The stress is analyzed by applying a birefringence 2D evaluation device. In detail, the birefringence 2D dispersion evaluation device may be WPA-200 device of NPM (NIPPON PULSE KOREA CO., LTD). In detail, when data are read on a glass substrate along to a stress measuring route by a probe, measured values such as a birefringence value are inputted to the device, and stress in a measuring route is presented by pressure unit (ex. MPa) through a predetermined calculation process. In this time, stress can be measured by inputting a light elastic coefficient and the thickness of a measuring target, and 2.4 is applied as the light elastic value in the examples.

Detailed measurement example is described below.

An average diameter of the opening part was 100 μm, an average diameter of the minimum inner diameter part was 75 μm, and the stress of plain line and via line of four glass substrate samples with an average thickness of about 300 μm was measured while changing the positions 4 times or more, respectively. And Vp, Np, and P values are respectively shown in the Table 1 below, by using its average value.

TABLE 1

| (MPa) | Via line (Width) | | — | Via line (Length) | | — |
| --- | --- | --- | --- | --- | --- | --- |
| | Min | Max | — | Min | Max | — |
| Sample 1 | 0.03175 | 1.8855 | — | 0.10275 | 1.60825 | — |
| Sample 2 | 0.0315 | 1.062 | — | 0.1975 | 0.782 | — |
| Sample 3 | 0.04225 | 1.844 | — | 0.05375 | 1.56525 | — |
| Sample 4 | 0.04275 | 1.97675 | — | 0.14975 | 1.7165 | — |

| (MPa) | Plain line (Width) | | — | Plain line (Length) | | — |
| --- | --- | --- | --- | --- | --- | --- |
| | Min | Max | — | Min | Max | — |
| Sample 1 | 0.169 | 0.89475 | — | 0.2055 | 0.77325 | — |
| Sample 2 | 0.0845 | 0.90175 | — | 0.263 | 0.71125 | — |
| Sample 3 | 0.047 | 0.51625 | — | 0.07025 | 0.4895 | — |
| Sample 4 | 0.0875 | 0.69275 | — | 0.19925 | 0.69875 | — |

| (MPa) | Vp (Width) | Vp (Length) | Np (Width) | Np (Length) | P (Width) | P (Length) |
| --- | --- | --- | --- | --- | --- | --- |
| Sample 1 | 1.85 | 1.51 | 0.73 | 0.57 | 1.13 | 0.94 |
| Sample 2 | 1.03 | 0.58 | 0.82 | 0.45 | 0.21 | 0.14 |
| Sample 3 | 1.80 | 1.51 | 0.47 | 0.42 | 1.33 | 1.09 |
| Sample 4 | 1.93 | 1.57 | 0.61 | 0.50 | 1.33 | 1.07 |

The core distribution layer 24 comprises a core distribution pattern 241, which is an electrically conductive layer electrically connecting the first surface and the second surface of the glass substrate through a through-via, and a core insulating layer 223 surrounding the core distribution pattern. The core layer 22 has an electrically conductive layer formed therein through a core via and thus serves as an electrical passage crossing the glass substrate 21, connects an upper and a lower part of the glass substrate with a relatively short distance, and thereby may have properties of faster electrical signal transmission and lower loss.

The core distribution pattern 241 is a pattern that electrically connect the first surface 213 and the second surface 214 of the glass substrate through a core via 23, and, specifically, it comprises a first surface distribution pattern 241a, which is an electrically conductive layer disposed on at least a part of the first surface 213, a second surface distribution pattern 241c, which is an electrically conductive layer disposed on at least a part of the second surface 214, and a core via distribution pattern 241b, which is an electrically conductive layer electrically connecting the first surface distribution pattern and the second surface distribution pattern to each other through the core via 23. As the electrically conductive layers, for example, a copper plating layer may be applicable, but not limited thereto.

The glass substrate 21 serves as an intermediate role or an intermediary role, connecting a semiconductor element unit 30 and a motherboard 10 to an upper and a lower part thereof, respectively, and the core via 23 serves as a transmitting passage for electrical signals thereof, thereby facilitating signal transmission.

A thickness of an electrically conductive layer measured at a larger one between the first opening part diameter and the second opening part diameter may be equal to or thicker than a thickness of an electrically conductive layer formed on a part with a minimum inner diameter in a core via.

The core distribution layer 24 is an electrically conductive layer formed on a glass substrate, and may satisfy that a cross-cut adhesion test value according to ASTM D3359 is 4B or greater, and specifically may satisfy that the cross-cut adhesion test value is 5B or greater. Also, an electrically conductive layer which is a core distribution layer 24, may have an adhesive strength of 3 N/cm or more and a bonding strength of 4.5 N/cm or more with respect to the glass substrate 21. When such a degree of bonding strength is satisfied, it has a sufficient bonding strength between a substrate and an electrically conductive layer, to be applied as a packaging substrate.

An upper layer 26 is disposed on the first surface 213.

The upper layer 26 may comprise an upper distribution layer 25 and an upper surface connecting layer 27 disposed on the upper distribution layer 25, and the uppermost surface of the upper layer 26 may be protected by a cover layer 60 having an opening part formed thereon, which is capable of being in direct contact with a connecting electrode of the semiconductor element unit.

The upper distribution layer 25 comprises an upper insulating layer 253 disposed on the first surface; and an upper distribution pattern 251 that has a predetermined pattern and is an electrically conductive layer at least a part of which is electrically connected to the core distribution layer 24, and built in the upper insulting layer.

Anything applied as an insulating layer to a semiconductor element or a packaging substrate, is applicable to the upper insulating layer 253, for example, an epoxy-based resin comprising a filler may be applied, but not limited thereto.

The insulating layer may be formed by a method of forming and hardening a coating layer, or by a method of laminating an insulating film which is being filmed in a state of non-hardened or semi-hardened to a core layer and hardening it. In this time, when a method of pressure sensitive lamination and the like is applied, the insulator is embedded even in the space inside a core via, and thus efficient process proceeding can be made. Also, even though plural-layered insulating layers are applied with being stacked, substantial distinction between the layers may be difficult, so that a plurality of insulating layer are collectively referred to as an upper insulating layer. Also, the core insulating layer 223 and the upper insulating layer 253 may be applied with the same insulating material, and in this case, the boundary therebetween may not be substantially distinguished.

The upper distribution pattern 251 refers to an electrically conductive layer disposed in the upper insulating layer 253 in a predetermined form. For example, it may be formed by a method of a build-up layer method. In detail, the upper distribution pattern 251 where electrically conductive layer is vertically or horizontally formed in a desired pattern, may be formed by repeating a process of: forming an insulating layer, removing an unnecessary part of the insulating layer and then forming an electrically conductive layer through a method of copper plating and the like, removing an unnecessary part of the electrically conductive layer and then forming an insulating layer on this electrically conductive layer again, and removing an unnecessary part again and then forming an electrically conductive layer through a method of plating and the like.

Since the upper distribution pattern 251 is disposed between the core layer 22 and the semiconductor element unit 30, it is formed to at least partially comprises a fine pattern so that the transmission of electrical signals with the semiconductor element unit 30 may proceed smoothly and a desired complicated pattern may be sufficiently accommodated. In this case, the fine pattern may have a width and an interval of about less than 4 μm, 3.5 μm or less, 3 μm or less, 2.5 μm or less, or 1 to 2.3 μm, respectively (Hereinafter, the description of the fine pattern is the same).

In order to form the upper distribution pattern 251 to comprise a fine pattern, at least two or more methods are applied in the present disclosure.

One of them, is to apply a glass substrate 21, as a glass substrate 21 of a packaging substrate. The glass substrate 21 can have a considerably flat surface property with a surface roughness (Ra) of 10 angstroms or less, and thereby minimizing the influence of surface morphology of a supporting substrate on formation of the fine pattern.

The other one, is based on the property of the insulating layer. In case of the insulating layer, a filler component is often applied in addition to resin, and inorganic particles such as silica particles may be applicable as the filler. When the inorganic particles are applied to the insulating layer as the filler, the size of the inorganic particles can affect whether to form the fine pattern, and therefore, the insulating layer in the present disclosure applies particle fillers with an average diameter of about 150 nm or less, and in detail, including particle fillers with an average diameter of 1 to 100 nm. Such a characteristic can minimize the influence of the insulating layer itself on the formation of an electrically conductive layer with a width of several micrometer-unit, while maintaining necessary properties for the insulating layer at a certain level or more, and can also help to form a fine pattern with good adhesion onto the surface, due to the fine surface morphology.

The upper surface connecting layer 27 comprises an upper surface connecting pattern 272 disposed in the upper insulating layer 253, and at least a part of which is electrically connected to the upper distribution pattern 251, and an upper surface connecting electrode 271, electrically connecting the semiconductor element unit 30 and the upper surface connecting pattern 272. The upper surface connecting pattern 272 may be disposed on one surface of the upper insulating layer 253 or may be embedded with at least a part of which is being exposed on the upper insulating layer. For example, when the upper surface connecting pattern is disposed on one side of the upper insulating layer, the upper insulating layer may be formed by a method of plating and the like, and when the upper surface connecting pattern is embedded with at least a part of which is being exposed on the upper insulating layer, it may be the one which is formed by forming a copper plating layer and the like, and then a part of an insulating layer or electrically conductive layer is removed by a method of surface polishing, surface etching and the like.

The upper surface connecting pattern 272 may at least partially comprise a fine pattern like the above-described upper distribution pattern 251. The upper surface connecting pattern 272 including the fine pattern like this may enable a larger number of elements to be electrically connected to one another even in a narrow area, facilitate electrical signal connection between elements or with the external, and more integrated packaging is possible.

The upper surface connecting electrode 271 may be connected to the semiconductor element unit 30 directly through a terminal and the like or via an element connecting unit 51 such as a solder ball.

The cavity unit 28 comprises a cavity distribution layer 282 disposed above and/or under the second area and electrically connected to the core distribution layer, and an inner space 281 where a cavity element 40 is disposed.

In detail, a thickness of the glass substrate in the second area is thinner compared to the first area, a cavity element 40 may be disposed at an inner space 281 formed due to the difference of the thickness. In addition, a core via and a core distribution layer, formed on the glass substrate, serve as an electrical connection structure which connect the cavity element and an external element.

The cavity unit 28 is substantially a circle shape, a triangle shape, a quadrangle shape, a hexagon shape, an octagon shape, a cross shape, etc., and not be limited in its shape, but a quadrangle is described as an example, in the present disclosure.

One side surface of the cavity unit 28 further comprises a supporting unit 285 protruded to the inner space.

When one side surface of the cavity unit 28 is referred to as a cavity first side surface 281a, and the other side surface which is different with the cavity first side surface is referred to as a cavity second side surface 281b, the supporting unit 285 may be disposed in at least one from the cavity first side surface 281a and the cavity second side surface 281b.

Also, a first side surface supporting unit 285a and a second side surface supporting unit 285b may be disposed at the cavity first side surface 281a and the cavity second side surface 281b neighboring to each other, respectively.

The first side surface supporting unit 285a and the second side surface supporting unit 285b serve as supporting the cavity element 40 and fixing the position thereof. Compared to the one which applied only one supporting unit, applying two or more supporting bodies neighborly to each other is possible to fix the position of a cavity element more strongly.

One having elasticity like a spring may be applied to the supporting unit 285, in detail, the supporting unit 285 may be formed with the same material as the glass substrate 21 and may be a glass spring supporting unit with elasticity to a direction opposite to the strength applied to the supporting unit by the cavity element 40.

The cavity element 40 may have a shape of cylinder, rectangular parallelepiped, or a polygon, substantially.

An angle at a place where the cavity first side surface 281a and the cavity second side surface 281b are in contact, may be 45 to 135 degrees, 75 to 105 degrees, or substantially 90 degrees. By the side surface supporting body respectively prepared on the cavity first side surface 281a and the cavity second side surface 281b, the cavity element 40 can be supported stably even when an angle at a place where the cavity first side surface 281a and the cavity first side surface 281a themselves are in contact, is an arbitrary angle in the above range.

At a place (Contact point of a first tangent line and a second tangent line) where a tangent line (a first tangent line) at a place where the first side surface supporting unit 285a with an arc shape is in contact with the cavity element, and a tangent line (a second tangent line) at a place where the second side surface supporting unit 285b with an arc shape is in contact with the cavity element, meet each other, an angle between the first tangent line and the second tangent line may be 45 to 135 degrees, 75 to 105 degrees, or practically 90 degrees. In this case, even though the shape of cavity element is not only an angular but also a non-angular form, it may be more advantageous for fixing its position.

A first side surface supporting unit length CS1 which is a length to the maximum protruded part of the first side surface supporting unit 285a may be 15% or less, or 10% or less, when the cavity first side surface length C1 is designated as 100%. Also, the first side surface supporting unit length CS1 may be 1% or more, or 3% or more, when the cavity first side surface length C1 is designated as 100%.

A second side surface supporting unit length CS2 which is a length to the maximum protruded part of the second side surface supporting unit 285b may be 15% or less, or 10% or less, when the cavity first side surface length C2 is designated as 100%. Also, the second side surface supporting unit length CS2 may be 1% or more, or 3% or more, when the cavity first side surface length C2 is designated as 100%.

The supporting unit 285 may be directly connected to the glass substrate 21 thereby composing one body. In this case, the supporting unit 285 may be formed through etching of the glass substrate, so that the process of manufacturing a glass substrate may be more simplified, and the mechanical properties of the supporting unit with elasticity force are substantially similar to the glass substrate, and thus it may be more advantageous for controlling mechanical properties of a packaging substrate.

When the supporting unit 285 serves as supporting a cavity element derived from the side surface of the cavity unit and to be inserted, it is sufficient, and in detail, it may have an arc shape connecting from one point of a side surface of the cavity unit to another point, or may have an arc shape connecting from one end of the side surface and to another end. When the supporting unit has an arc shape, the supporting unit lengths CS1 and CS2 may be measured in a middle part of the supporting unit of an arc shape.

A length from the most protruded position of the first side surface supporting unit 285a to a side surface of the cavity unit facing it, and a length from the most protruded position of the second side surface supporting unit 285b to a side surface of the cavity unit facing it, may respectively be the same as a length at a corresponding position of a cavity element to be inserted to the cavity unit, or smaller by 10% or less, or desirably, 0.1 to 8%. In this case, it is more advantageous for the supporting unit to stably fix the cavity element.

The cavity unit 28 may comprise a cavity distribution pattern which is an electrically conductive layer electrically connecting the cavity element 40 and the core distribution layer 24, and the cavity distribution pattern may comprise a side surface wall pattern 283a which is an electrically conductive layer disposed on a surface in a thickness direction of the glass substrate 21 at the border of the first area and the second area. However, it is desirable that the side wall surface pattern is formed at a surface except for a side surface where the supporting body is formed.

The side wall surface pattern 283a may serve as transmitting electrical signals, and also may function as a heat-emitting layer transferring heat generated at the cavity unit 28 by a cavity element, etc., to the external.

In detail, the cavity distribution layer 282 may comprise a cavity distribution pattern (283) which is an electrically conductive layer electrically connected to a cavity element 40 at least of a part of which is disposed in the inner space, and electrically connected to the core distribution layer, and/or a side wall surface pattern 283a, and a cavity insulating layer 284 which is an insulating layer surrounding it.

The cavity distribution pattern may be formed on the packaging substrate, or provided as a terminal form such as an electrode 42 (connecting electrode) of the cavity element.

The cavity element 40 may comprise a transistor. When an element such as a transistor serving as converting electrical signals between a motherboard and a semiconductor element unit into a proper level, is used as the cavity element 40, it would be a form that a transistor and the like is applied in a path of the packaging element 20, and then it is possible to provide a semiconductor device 100 which is more efficient and having rapid rate.

Passive elements such as capacitor may be individually inserted and applied to the cavity element 40, or may be inserted inside the cavity element after the element group comprising multiple passive elements as a shape of being embedded between insulating layer 46 (Cavity element insulating layer), is formed to expose its electrode. The latter case can facilitate workability of manufacturing a packaging substrate, and it is more advantageous for sufficiently and highly-reliably positioning an insulating layer in a space between complicated elements.

In addition, a second area core via 232 in contact with the electrode of the cavity element 40 may have a core distribution pattern formed as a shape of a filled via 283c. For example, a core via distribution pattern 241b which is a core distribution pattern formed on a first area core via 231, may have a shape of being filled with a core insulating layer inside it, and a space may be formed inside when observed at a side of an electrically conductive layer such as a metal layer. However, unlike this, in the case of a core via connected to a cavity element 40 above, may have a shape of a filled via 283c in which an electrically conductive layer is filled with. In this case, it is possible to facilitate electric power transmission of a cavity element in which a capacitor or the like is disposed, and thereby enhancing properties of a packaging substrate is possible.

Specifically, a cavity element 40 may be disposed at a cavity unit 28 disposed under the second area 222. Also, the cavity element may be electrically connected to a motherboard 10 by a connecting electrode directly, which is formed on its lower surface, or through a lower layer.

Specifically, a cavity element 40 may be disposed at a cavity unit 28 disposed above the second area 222. Also, the cavity element may be electrically connected to a semiconductor element unit 30 by a connecting electrode directly, which is formed on its upper surface, or through an upper layer.

When the cavity unit is disposed above or under the second area like this, it is possible to connect at least one connecting electrode among connecting electrodes present at both sides of the cavity element, directly to an upper layer or a lower layer of the glass substrate or directly connect to a semiconductor element or a motherboard, and thereby it is possible to provide a semiconductor device with a simpler structure.

The heat-emitting unit H may be disposed at a surface where the first area 221 of the glass substrate and the inner space 281 of the cavity unit are in contact.

The heat-emitting unit H may be disposed between the first area 221 and the second area 222 of the glass substrate, and between the first area 221 of the glass substrate and the inner space 281 of the cavity unit.

The heat-emitting unit H may be at least partially connected to the core distribution layer 24.

In detail, when the inner space 281 is disposed above the second area, the heat-emitting unit H may be connected to at least a part of the first surface distribution pattern 241a of the second area. In detail, when the inner space 281 is disposed under the second area, the heat-emitting unit H may be connected to at least a part of the second surface core pattern 241b of the second area.

The heat-emitting unit H may transfer the heat generated from the cavity unit 28 to the external of the packaging substrate. Also, the heat-emitting unit H connected with the core pattern layer to each other, may be connected to the core distribution layer, or connected to an electrically conductive layer of an upper layer and/or the lower layer, the heat-emitting layer, etc., and thereby emitting the heat generated from connected elements and the like, to the external of the semiconductor packaging.

The heat-emitting unit H and the cavity distribution layer 282 may be electrically insulated by a cavity insulating layer 284 which is an insulating layer surrounding the cavity distribution layer.

Separate heat-emitting materials may be applied to the heat-emitting unit, and also, a metal layer simultaneously having electrical conductivity and heat-emitting property may be applied to it. In this case, the heat-emitting unit is required to be insulated from distribution layers, particularly a cavity distribution layer which is easy to be located neighboring to, except for predetermined area for a connection. Such insulating process may proceed similarly to the method of forming an insulating layer described above.

Like the above description, the cavity unit 28 may include a cavity distribution pattern 283 which is an electrically conductive layer electrically connecting the cavity element 40 and the core distribution layer 24, and a side wall surface pattern (not shown) which is an electrically conductive layer disposed on a surface in a thickness direction of the glass substrate 21 at the border of the first area and the second area. The side wall surface pattern may serve as the heat-emitting unit H, and particularly, when an electrically conductive layer with a comparatively high heat conductivity is applied as the side wall surface pattern, it may serve as the side wall surface pattern and the heat-emitting unit at the same time.

The heat-emitting unit H may be applied with the one with a heat conductivity of 300 to 450 W/(m·k).

The heat-emitting unit H may be applied with the same material with the electrically conductive layer.

The heat-emitting unit H may be formed together when the electrically conductive layer is formed.

The heat-emitting unit H may be an electrically conductive metal layer with a thickness of 4 μm or more.

The heat emitting unit H is a heat conductive layer formed on a glass substrate, and may satisfy that a cross-cut adhesion test value according to ASTM D3359 is 4B or greater, and specifically may satisfy that the cross-cut adhesion test value is 5B or greater. Also, an electrically conductive layer which is a core distribution layer 24, may have an adhesive strength of 3 N/cm or more and a bonding strength of 4.5 N/cm or more with respect to the glass substrate. When such a degree of bonding strength is satisfied, it has a sufficient bonding strength between a substrate and heat-emitting unit, to be applied as a packaging substrate.

The packaging substrate 20 may further comprise a lower layer 29 disposed under the core layer 22.

The lower layer 29 may include a lower distribution layer 291 electrically connected to the core distribution layer and a lower surface connecting layer 292 providing a lower surface connecting electrode 292a connected to a motherboard of external. In this time, the heat-emitting unit H may be connected to the lower distribution layer 291.

Specifically, the cavity unit 28 serves as a path for transmitting electric signals and a path for transferring heat, by a side wall surface pattern 283a which is an electrically conductive layer. There are demands for packaging substrates to have heat-emitting function that is emitting heat generated from the internal of packaging or heat transmitted to packaging substrate, which is generated from external elements. When an electrically conductive layer applied with a material like a metal such as copper which has excellent heat conductivity, is applied to the side wall surface of the cavity unit, and the like, two effects that are transmission of electrical signals and heat-emitting are obtained at the same time. Additionally, such a side wall surface pattern can be formed together in a process for forming a core distribution pattern or the like, so that efficiency on the process of manufacturing is also great.

The packaging substrate 20 is also connected to the motherboard 10. The motherboard 10 may be directly connected to the second surface distribution pattern 241c, which is a core distribution layer disposed on at least a part of the second surface 214 of the core layer 22, through a motherboard terminal or may be electrically connected via a board connecting unit such as a solder ball. Also, the second surface distribution pattern 241c may be connected to the motherboard 10 via the lower layer 29 disposed under the core layer 22.

The lower layer 29 comprises a lower distribution layer 291 and a lower surface connecting layer 292.

The lower distribution layer 291 comprises i) a lower insulating layer 291b at least a part of which is in contact with the second surface 214; and ii) a lower distribution pattern 291a being embedded in the lower insulating layer and having a predetermined pattern, and at least a part of which is electrically connected to the core distribution layer.

The lower surface connecting layer 292 comprises i) a lower surface connecting electrode 292a electrically connected to the lower surface connecting pattern and may further comprise ii) a lower surface connecting pattern 292b at least a part of which is electrically connected to the lower distribution pattern, and at least a part of which is exposed to one surface of the lower insulating layer.

The lower surface connecting pattern 292b, which is a part connected to the motherboard 10, may be formed as a non-fine pattern wider than the fine pattern, unlike the upper surface connecting pattern 272, for more efficient transmitting of electrical signals.

Not applying a substantially additional different substrate other than the glass substrate 21 to the packaging substrate 20 disposed between the semiconductor element unit 30 and the motherboard 10, is one feature of the present disclosure.

Conventionally, an interposer and an organic substrate were applied with being stacked between connection of the element and the motherboard. It is considered that such a multi-stage form has been applied in at least two reasons. One reason is that there is a scale problem in directly bonding the fine pattern of the element to the motherboard, and the other reason is that problem of wiring damage may occur due to a difference in thermal expansion coefficient during the bonding process or during the driving process of the semiconductor device. The embodiment has solved these problems by applying the glass substrate with a thermal expansion coefficient similar to that of the semiconductor element, and by forming a fine pattern with a fine scale enough to mount the elements on the first surface of the glass substrate and its upper layer.

In the embodiment of an electrically conductive layer composing the core distribution pattern 241, a thickness of the electrically conductive layer may be 90% or more, 93% to 100%, or 95% to 100%, when a distance from an inner diameter surface of the core via 23 to a surface of the core via distribution pattern 241 is 100% as total. In addition, in an electrically conductive layer composing the core distribution pattern 241, a thickness of the electrically conductive layer may be 97% to 100%, or 96% to 100%, when a distance from an inner diameter surface of the core via 23 to a surface of the core distribution pattern 241 is 100% as total.

A distance between a surface close to an inner diameter surface of the core via of the core via pattern, and the inner diameter surface of the core via may be 1 μm or less, and an adhesion layer and the like with a thickness of 1 μm or more may be substantially not separately formed between an inner diameter surface and an electrically conductive layer.

Specifically, at an opening where a larger one between a first surface opening part diameter CV1 and the second surface opening part diameter CV2 is disposed, a thickness of the electrically conductive layer may be 90% or more, 93 to 100%, 95 to 100%, or 98 to 99.9%, when a distance from an inner diameter surface of the core via 23 to a surface of the core distribution pattern 241 is 100% as total.

Specifically, at a position of minimum inner diameter CV3, a thickness of the electrically conductive layer may be 90% or more, 93 to 100%, 95 to 100%, or 95.5 to 99%, when a distance from an inner diameter surface of the core via 23 to a surface of the core distribution pattern 241 is 100% as total.

When the core distribution pattern 241 is allowed to be formed close to the inner diameter surface of the core via 23, that is substantially to be directly formed on the inner diameter surface, not only the treatment process becomes more simplified, thereby improving process efficiency, but the core via pattern can also be formed more thick, so that the space efficiency can be more improved and electrical properties of the packaging substrate within a determined space can be more improved.

In the embodiment, a thickness of a thinner one among the electrically conductive layers of the core distribution layer 24 may be the same as or greater than the thickness Tus of a thinner one among the electrically conductive layers of the upper layer 26. When the thickness of a thinner one among the electrically conductive layers of the core distribution layer 24 is the same as or thicker than the thickness of a thinner one among the electrically conductive layers of the upper layer 26 like this, electrical signal transmittance may be made more efficient between an element and a motherboard.

A thickness of an electrically conductive layer at a minimum inner diameter of the core via 23 may be the same as or greater than a thickness of a thinner one among the electrically conductive layers of the upper layer 26. When the thickness of an electrically conductive layer at the minimum inner diameter of the core via is the same as or greater than the thickness of a thinner one among the electrically conductive layers of the upper layer like this, electrical signal transmittance may be made more efficient between an element and a motherboard.

In the embodiment, an average thickness of the core distribution pattern 241 may have a thickness Tcv thicker by 0.7 to 12 times based on a thickness Tus of a thinner one in the upper surface connecting pattern 272, or may have a thickness Tcv thicker by 1.0 to 10 times. Also, the core distribution pattern 241 may have a thickness Tcv thicker by 1.1 to 8 times based on a thickness Tus of a thinner one in the upper surface connecting pattern 272, or may have a thickness Tcv thicker by 1.1 to 6 times, or may have a thickness Tcv thicker by 1.1 to 3 times. In case of having a core distribution pattern 241 with such a thickness ratio, a process of connecting electrical signals from a highly integrated element to a motherboard can be made more efficient.

The core distribution pattern 241 may be a shape that an electrically conductive layer is formed in a uniform thickness at the inner diameter of core via and an insulating layer may occupy the remainder, like illustrated in FIGs. And the space of core via may be occupied with an electrically conductive layer without remaining space, as needed. When the space of core via is occupied with an electrically conductive layer like this, a distance from one side of the core via pattern close to an inner diameter surface, to the center of an electrically conductive layer is designated as a width of the core via pattern (Same as below).

In the embodiment, a thicker one in a second surface distribution pattern 241c, may have a wiring thickness Tsc thicker by 0.7 to 20 times based on a thickness Tus of a thinner one in the upper surface connecting pattern 272, or may have a wiring thickness Tsc thicker by 0.7 to 15 times. Also, the second surface distribution pattern 241c may have a wiring thickness Tsc thicker by 1 to 12 times based on a thickness Tus of a thinner one in the upper surface connecting pattern 272, or may have a wiring thickness Tsc thicker by 1.1 to 5 times. When the second surface distribution pattern 241c has such a wiring thickness, a process of connecting electrical signals from a highly integrated element to a motherboard can be made more efficient.

In the embodiment, the lower surface connecting pattern 292b may have a thickness Tds thicker by 0.7 to 30 times based on a thickness Tus of a thinner one in the upper surface connecting pattern 272, may have a thickness Tds thicker by 1 to 25 times, or may have a thickness Tds thicker by 1.5 to 20 times. When a lower surface connecting pattern 292a with such a ratio is applied, a process of connecting electrical signals from a highly integrated element to a motherboard can be made more efficient.

The semiconductor device 100 having a considerably thin packaging substrate 30 may make the overall thickness of the semiconductor device thinner, and it is also possible to dispose a desired electrical connecting pattern even in a narrower area by applying the fine pattern. In detail, the packaging substrate 30 may have a thickness of 2000 µm or less, 1800 µm or less, or 1500 µm. Also, the packaging substrate 30 may have a thickness of 350 µm or more, or 550 µm or more. Due to the above-described characteristics, the packaging substrate can stably connect the element and the motherboard electrically and structurally even with a relatively thin thickness, thereby contributing to miniaturization and thinning of the semiconductor device.

The method of manufacturing the packaging substrate of the embodiment comprises a preparation step of forming a defect at predetermined positions of a first surface and a second surface of a glass substrate; an etching step of preparing a glass substrate with a core via formed thereon by applying an etchant to the glass substrate where the defect is formed; a core layer forming step of plating the surface of the glass substrate with the core via formed thereon, to form a core distribution layer which is an electrically conductive layer, and thereby forming a core layer; and an upper layer forming step of forming an upper distribution layer, which is an electrically conductive layer surrounded by an insulting layer on one side of the core layer, and thereby manufacturing the packaging substrate described above.

The core layer forming step may comprise a pretreatment process of preparing a pretreated glass substrate by forming an organic-inorganic composite primer layer containing a nanoparticle with amine-group on a surface of the glass substrate where the core via is formed; and a plating process of plating a metal layer on the glass substrate which is pretreated.

The core layer forming step may comprise a pretreatment process of preparing a pretreated glass substrate by forming a metal-containing primer layer through sputtering on a surface of the glass substrate where the core via is formed; and a plating process of plating a metal layer on the glass substrate which is pretreated.

An insulating layer forming step may be further comprised between the core layer forming step and the upper layer forming step.

The insulating layer forming step may be a step of positioning an insulating film on the core layer and performing pressure sensitive lamination to form a core insulating layer.

The method of manufacturing the packaging substrate will be described in more detail.

1) Preparation Step (Glass Defect Forming Process): A glass substrate having flat first surface and second surface was prepared, and a defect (groove) was formed at a predetermined position on the surface of the glass substrate to form a core via. As the glass substrate, a glass substrate applied to a substrate for electronic device, etc., for example, non-alkalic glass substrate, etc. is applicable, but not limited thereto. As a commercial product, product manufactured by manufacturers such as CORNING, SCHOTT, AGC may be applied. In this time, a glass substrate where a cavity unit is formed by a method of removing a part of the glass substrate may be applicable, a glass substrate with a cavity unit formed by bonding flat glass substrates may be applicable, or it is also possible to simultaneously manufacture a core via and a cavity unit by also forming a defect described below on a cavity unit of a flat glass substrate. In addition, also a supporting unit may be formed simultaneously or separately with the manufacturing of the cavity unit. For formation of the defect (groove), a method of mechanical etching, laser irradiation, and the like can be applied.

2-1) Etching Step (Core Via Forming Step): On the glass substrate where the defect (groove) is formed, a core via is formed through a physical or chemical etching process.

During the etching process, the glass substrate forms vias in the parts with defect, and at the same time, the surface of the glass substrate may be simultaneously etched. A masking film may be applied to prevent the etching of the glass surface, but the defective glass substrate itself may be etched in consideration of the inconvenience, etc. of the process of applying and removing the masking film, and in this case, a thickness of the glass substrate having the core via may be slightly thinner than the thickness of the first glass substrate.

Chemical etching may be proceeded by placing a glass substrate where a groove is formed, in a bath containing hydrofluoric acid and/or nitric acid, and applying ultrasonic treatment, etc. In this case, the hydrofluoric acid concentration may be 0.5 M or more, and may be 1.1 M or more. The hydrofluoric acid concentration may be 3 M or less, and may be 2 M or less. The nitric acid concentration may be 0.5 M or more, and may be 1 M or more. The nitric acid concentration may be 2 M or less. The ultrasonic treatment may be performed at a frequency of 40 Hz to 120 Hz, and may be performed at a frequency of 60 Hz to 100 Hz.

2-2) Cavity Unit Forming Step: A cavity unit is formed by removing a part of the glass substrate simultaneously or separately with the etching process. In detail, another defect for forming the cavity unit is separately formed in addition to the defect for forming the core via above. Subsequently, a glass substrate having a second area with a thickness thinner than a first area, is manufactured simultaneously with etching for forming the core via, or manufactured by a separate etching process. In addition, a supporting unit may be formed together simultaneously with formation of a core via and a cavity unit during the etching process, by a method of setting the lasers to be irradiated to not remove a part of the inside of the cavity part.

3-1) Core Layer Forming Step: An electrically conductive layer is formed on the glass substrate. As for the electrically conductive layer, a metal layer containing copper metal may be applied representatively, but not limited thereto.

A surface of the glass (including a surface of a glass substrate and a surface of a core via) and a surface of the copper metal have different properties, so the adhesion strength is rather poor. In the embodiment, the adhesion strength between the glass surface and the metal is improved by two methods, a dry method and a wet method.

The dry method is a method applying sputtering, that is, a method of forming a seed layer inside the core via and on the glass surface through metal sputtering. For the formation of the seed layer, different kinds of metals such as titanium, chromium, and nickel may be sputtered with copper, etc., and in this case, it is considered that the adhesiveness of glass-metal is improved by surface morphology of glass, an anchor effect which is an interaction between metal particles, and the like.

The wet method is a method applying primer treatment, that is, a method of forming a primer layer by performing pre-treatment with a compound having a functional group such as amine After pre-treatment by using a silane coupling agent depending on the degree of intended adhesion strength, primer treatment may be done with a compound or particles having an amine functional group. As mentioned above, a supporting body substrate of the embodiment needs to be of high performance enough to form a fine pattern, and it should be maintained after the primer treatment. Therefore, when such a primer comprises a nanoparticle, it is desirable to apply a nanoparticle with an average diameter of 150 nm or less, for example, a nanoparticle is desirable to be applied to a particle with amine functional group. The primer layer may be formed by applying an adhesive strength improving agent manufactured in CZ series by MEC Inc, for example.

In the seed layer/primer layer, an electrically conductive layer may selectively form a metal layer in the state of removing a part where the formation of an electrically conductive layer is unnecessary, or not removing. Also, in the seed layer/primer layer $21c$, a part where the formation of an electrically conductive layer is necessary, or a part where it is unnecessary, may be selectively processed to be an activated state or an inactivated state for metal plating. The processing to be an activated state or an inactivated state may be performed, for example, by using light irradiation treatment such as laser light of a certain wavelength, etc., chemical treatment, and the like. A copper plating method, etc. applied to manufacturing a semiconductor element may be applied to form the metal layer, but not limited thereto.

During the metal plating, a thickness of an electrically conductive layer formed, may be controlled by regulating several variables such as the concentration of plating solution, plating time, and type of additive to be applied.

When a part of the core distribution layer is unnecessary, it may be removed, and an etched layer $21e$ of a core distribution layer may be formed by performing metal plating to form an electrically conductive layer as a predetermined pattern, after the seed layer is partially removed or processed to be inactivated.

A heat-emitting unit is formed by applying a copper or the like, which is an electrically conductive layer and with an excellent heat conductivity, at the same time with the forming of the core distribution layer. The heat-emitting unit may be formed separately from the forming of the core distribution layer, but process efficiency can be more improved because the core distribution layer and the heat-emitting unit can be formed at the same time by the above plating process or the like.

It may be regulated to form or not form a separate electrically conductive layer at the supporting unit during the process of forming the core distribution layer.

In addition, at least a part of a core via $232$ (a second area core via) connected to the electrode of the cavity element, may be manufactured in a shape of a filled via $283c$ for more efficient transmittance of electric power, and in a plating layer forming step together, or through a separate filled via forming step, the second area core via may be filled with a metal such as copper forming an electrically conductive layer, and thereby may form a filled via which is capable of more efficient transmittance of signals.

Also, the cavity element may be inserted before a subsequent insulating layer forming step.

3-2) Insulating Layer Forming Step: An insulating layer forming step in which an empty space of a core via is filled with an insulating layer after the core distribution layer, which is an electrically conductive layer, is formed, may be performed. In this case, the one manufactured in a film type may be applied to the applied insulating layer, and for example, a method such as pressure sensitive laminating the film-type insulating layer may be applied. When proceeding the pressure sensitive laminating like this, the insulating layer may be sufficiently subsided to the empty space inside the core via to form a core insulating layer without void formation.

4) Upper Layer Forming Step: It is a step of forming an upper distribution layer including an upper insulating layer and an upper distribution pattern on a core layer. The upper distribution layer may be formed by a method of coating a resin composition forming an insulating layer $23a$, or laminating an insulating film. For simplicity, applying a method of laminating an insulating film is desirable. The laminating of the insulating film may be proceeded by a process of laminating and then hardening, and in this case, if a method of the pressure sensitive lamination is applied, the insulating resin may be sufficiently subsided even into a layer where an electrically conductive layer is not formed inside the core via. The upper insulating layer is also in direct contact with a glass substrate at least in part thereof, and thus the one with a sufficient adhesive force is applied. Specifically, it is desirable that the glass substrate and the upper insulating layer have characteristics that satisfy an adhesion strength test value of 4B or more according to ASTM D3359.

The upper distribution pattern may be formed by repeating a process of forming the insulating layer 23a, forming an electrically conductive layer 23c to have a predetermined pattern, and forming an etched layer 23d of the electrically conductive layer by etching the unnecessary part, and in the case of an electrically conductive layer formed to neighbor with having an insulating layer disposed therebetween, it may be formed by a method of performing a plating process after forming a blind via 23b in the insulating layer. For formation of the blind via, a dry etching method such as laser etching and plasma etching, and a wet etching method using a masking layer and an etching solution may be applied.

5) Upper Surface Connecting Layer and Cover Layer Forming Step: Upper surface connecting pattern and upper surface connecting electrode may be performed by a process similar to forming the upper distribution layer. Specifically, it may be formed by a method such as forming an etched layer of an insulating layer on the insulating layer, and then forming an electrically conductive layer again thereon, and then forming an etched layer of the electrically conductive layer, but a method of selectively forming only an electrically conductive layer without applying a method of etching, may be also applied. A cover layer may be formed to have an opening part at a position corresponding to the upper surface connecting electrode such that the upper surface connecting electrode to be exposed and directly connected to an element connecting unit, a terminal of an element, or the like.

6) Lower Surface Connecting Layer and Cover Layer Forming Step: A lower distribution layer and/or a lower surface connecting layer, and optionally a cover layer may be formed in a manner similar to the upper surface connecting layer and the cover layer forming step, described above.

Although the desirable examples of the embodiment have been described in detail above, the scope of the embodiment is not limited thereto, and various modifications and alterations made by those skilled in the art using the basic concept of the embodiment defined in the following claims also fall within the scope of the embodiment.

| DESCRIPTION OF FIGURE NUMBERS | |
|---|---|
| 100: Semiconductor device | 10: Motherboard |
| 30: Semiconductor element unit | 32: First semiconductor element |
| 34: Second semiconductor element | 36: Third semiconductor element |
| 20: Packaging substrate | 22: Core layer |
| 223: Core insulating layer | 21, 21a: Glass substrate |
| 213: First surface | 214: Second surface |
| 23: Core via | 233: First opening part |
| 234: Second opening part | 235: Minimum inner diameter part |
| 24: Core distribution layer | 241: Core distribution pattern |
| 241a: First surface distribution pattern | 241b: Core via distribution pattern |
| 241c: Second surface distribution pattern | 26: Upper layer |
| 25: Upper distribution layer | 251: Upper distribution pattern |
| 252: Blind via | 253: Upper insulating layer |
| 27: Upper surface connecting layer | 271: Upper surface connecting electrode |
| 272: Upper surface connecting pattern | |
| 28: Cavity unit | |
| 281: Inner space | 281a: Cavity first side surface |
| 281b: Cavity second side surface | 282: Cavity distribution layer |
| 283: Cavity distribution pattern | 283a: Side wall surface pattern |
| 282b: Core cavity connecting pattern or Cavity element connecting electrode | |
| 283c: Filled via | 284: Cavity insulating layer |
| 285: Supporting unit | 29: Lower layer |
| 291: Lower distribution layer | 291a: Lower distribution pattern |
| 291b: Lower insulating layer | 292: Lower surface connecting layer |
| 292a: Lower surface connecting electrode | 292b: Lower surface connecting pattern |
| 40: Cavity element | 42: Cavity element electrode |
| 46: Cavity element insulating layer | 50: Connecting part |
| 51: Element connecting part | 52: Board connecting part |
| 60: Cover layer | H: Heat-emitting unit |

What is claimed is:

1. A packaging substrate comprising:
a core layer, and an upper layer disposed on the core layer, wherein:
the core layer comprises a glass substrate and a core via,
the glass substrate has a first surface and a second surface facing each other,
the glass substrate comprises a first area with a first thickness, and a second area close to the first area and with a second thickness thinner than the first thickness,
the core via passing through the glass substrate in a thickness direction is disposed in a plural number,
the core layer comprises a core distribution layer disposed on a surface of the glass substrate or the core via,
at least a part of the core distribution layer electrically connects an electrically conductive layer of the first surface and an electrically conductive layer of the second surface, through the core via, and
the upper layer is disposed on the first surface and comprises an electrically conductive layer which electrically connects the core distribution layer and an external semiconductor element unit; and a cavity unit disposed above or under the second area, the cavity unit comprising an inner space, a cavity distribution layer electrically connected to the core distribution layer, and a cavity element disposed in the inner space, wherein the packaging substrate further comprises a supporting unit protruded to the inner space, in at least one surface of the cavity unit.

2. The packaging substrate of claim 1, wherein the supporting unit has an arc-shape connecting one end and the other end of a side surface of the cavity unit.

3. The packaging substrate of claim 1, wherein the supporting unit is at least partially connected to one surface in a thickness direction of the first area, and another part of the supporting unit is protruded to the inner space, fixing the position of a cavity element to be inserted.

4. The packaging substrate of claim 1, wherein the supporting unit comprises a same material with the glass substrate.

5. The packaging substrate of claim 1, wherein:
one side surface of the cavity unit is a cavity first side surface,
the other side surface different with the cavity first side surface, is a cavity second side surface, and
the supporting unit is respectively disposed at the cavity first side surface and the cavity second side surface.

6. The packaging substrate of claim 1, wherein the cavity distribution layer comprises:
a cavity distribution pattern which is an electrically conductive layer electrically connected to the cavity element at least a part of which is disposed in the inner space, and electrically connected to the core distribution layer; and
a cavity insulating layer which is an insulating layer surrounding the cavity distribution pattern.

7. The packaging substrate of claim 1, further comprising:
a heat-emitting unit disposed between the core layer and the cavity unit,
wherein the heat-emitting unit is disposed at a surface where the first area of the glass substrate and the inner space of the cavity unit are in contact.

8. The packaging substrate of claim 7, wherein the heat-emitting unit is at least partially connected to the core distribution layer.

9. A semiconductor device comprising:
a semiconductor element unit where one or more semiconductor elements are disposed;
a packaging substrate electrically connected to the semiconductor element; and
a motherboard electrically connected to the packaging substrate, transmitting electrical signals of the semiconductor element and external, and connecting each other,
wherein the packaging substrate comprises:
a core layer, and an upper layer disposed on the core layer, and
wherein:
the core layer comprises a glass substrate and a core via,
the glass substrate has a first surface and a second surface facing each other,
the glass substrate comprises a first area with a first thickness, and a second area close to the first area and with a second thickness thinner than the first thickness,
the core via passing through the glass substrate in a thickness direction is disposed in a plural number,
the core layer comprises a core distribution layer disposed on a surface of the glass substrate or the core via,
at least a part of the core distribution layer electrically connects an electrically conductive layer of the first surface and an electrically conductive layer of the second surface, through the core via, and
the upper layer is disposed on the first surface and comprises an electrically conductive layer which electrically connects the core distribution layer and an external semiconductor element unit; and
a cavity unit disposed above or under the second area, the cavity unit comprising an inner space, a cavity distribution layer electrically connected to the core distribution layer, and a cavity element disposed in the inner space,
wherein the packaging substrate further comprises a supporting unit protruded to the inner space, in at least one surface of the cavity unit.

* * * * *